(12) United States Patent
Takenaka et al.

(10) Patent No.: US 11,810,620 B2
(45) Date of Patent: Nov. 7, 2023

(54) SEMICONDUCTOR STORAGE DEVICE

(71) Applicant: KIOXIA CORPORATION, Tokyo (JP)

(72) Inventors: Hiroyuki Takenaka, Kamakura Kanagawa (JP); Akihiko Chiba, Yokohama Kanagawa (JP); Teppei Higashitsuji, Fujisawa Kanagawa (JP); Kiyofumi Sakurai, Yokohama Kanagawa (JP); Hiroaki Nakasa, Yokohama Kanagawa (JP); Youichi Magome, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 36 days.

(21) Appl. No.: 17/458,067

(22) Filed: Aug. 26, 2021

(65) Prior Publication Data

US 2022/0246196 A1 Aug. 4, 2022

(30) Foreign Application Priority Data

Feb. 2, 2021 (JP) .................. 2021-015362

(51) Int. Cl.
 *G11C 8/12* (2006.01)
 *G11C 16/14* (2006.01)
 (Continued)

(52) U.S. Cl.
 CPC ............... *G11C 16/14* (2013.01); *G11C 5/06* (2013.01); *G11C 16/0483* (2013.01);
 (Continued)

(58) Field of Classification Search
 CPC ..... G11C 16/0483; G11C 16/10; G11C 16/08; G11C 16/26
 See application file for complete search history.

(56) References Cited

U.S. PATENT DOCUMENTS

2003/0235071 A1  12/2003  Okazawa
2016/0079164 A1  3/2016  Fukuzumi et al.
(Continued)

FOREIGN PATENT DOCUMENTS

JP  2016-062901 A  4/2016
JP  2018-026518 A  2/2018
(Continued)

OTHER PUBLICATIONS

U.S. Appl. No. 17/183,809.
U.S. Appl. No. 17/183,809, filed Feb. 24, 2021.

*Primary Examiner* — Mushfique Siddique
(74) *Attorney, Agent, or Firm* — Kim & Stewart LLP

(57) ABSTRACT

A semiconductor storage device includes a first semiconductor substrate, a second semiconductor substrate, a first memory cell and a second memory cell provided between the first semiconductor substrate and the second semiconductor substrate, a first word line electrically connected to the first memory cell, a second word line electrically connected to the second memory cell, a first transistor that is provided on the first semiconductor substrate and electrically connected between the first word line and a first wiring through which a voltage is applied to the first word line, and a second transistor that is provided on the semiconductor substrate and electrically connected between the second word line and a second wiring through which a voltage is applied to the second word line.

13 Claims, 25 Drawing Sheets

(51) Int. Cl.

| | |
|---|---|
| *G11C 5/06* | (2006.01) |
| *G11C 16/04* | (2006.01) |
| *G11C 16/26* | (2006.01) |
| *G11C 16/16* | (2006.01) |
| *G11C 16/30* | (2006.01) |
| *G11C 16/24* | (2006.01) |

(52) U.S. Cl.
CPC .............. *G11C 16/16* (2013.01); *G11C 16/24* (2013.01); *G11C 16/26* (2013.01); *G11C 16/30* (2013.01)

(56) References Cited

U.S. PATENT DOCUMENTS

| | | | |
|---|---|---|---|
| 2017/0084626 A1 | 3/2017 | Kim et al. | |
| 2019/0088676 A1* | 3/2019 | Tagami | ................... H01L 24/04 |
| 2019/0363129 A1* | 11/2019 | Yokoyama | .......... H01L 25/0657 |
| 2020/0105735 A1 | 4/2020 | Park et al. | |
| 2020/0185407 A1 | 6/2020 | Xiao et al. | |
| 2020/0273864 A1 | 8/2020 | Manipatruni et al. | |
| 2020/0365463 A1 | 11/2020 | Or-Bach et al. | |
| 2020/0395328 A1 | 12/2020 | Fastow et al. | |
| 2020/0395341 A1* | 12/2020 | Maejima | ................. G11C 16/08 |
| 2020/0411541 A1 | 12/2020 | Oh et al. | |
| 2021/0035888 A1 | 2/2021 | Chen et al. | |
| 2021/0287985 A1* | 9/2021 | Shirai | ................... H01L 23/528 |
| 2021/0295919 A1* | 9/2021 | Shimura | ................. H10B 41/41 |
| 2022/0077088 A1* | 3/2022 | Okada | ..................... H10B 41/27 |

FOREIGN PATENT DOCUMENTS

| | | |
|---|---|---|
| JP | 2018026518 A | 2/2018 |
| JP | 2018-117102 A | 7/2018 |
| JP | 2018117102 A | 7/2018 |
| JP | 2019-057532 A | 4/2019 |
| JP | 2019057532 A | 4/2019 |
| TW | 200400621 A | 1/2004 |
| TW | 200636737 A | 10/2006 |
| TW | 202101738 A | 1/2021 |
| TW | 202105686 A | 2/2021 |
| TW | 202107686 A | 2/2021 |

* cited by examiner

SEMICONDUCTOR STORAGE DEVICE

CROSS-REFERENCE TO RELATED APPLICATION

This application is based upon and claims the benefit of priority from Japanese Patent Application No. 2021-015362, filed Feb. 2, 2021, the entire contents of which are incorporated herein by reference.

FIELD

Embodiments described herein relate generally to a semiconductor storage device.

BACKGROUND

A semiconductor storage device of the related art includes a first semiconductor substrate, a second semiconductor substrate, a first memory cell and a second memory cell provided between the first semiconductor substrate and the second semiconductor substrate, a first word line connected to the first memory cell, a second word line connected to the second memory cell, a first transistor electrically connected to the first word line, and a second transistor electrically connected to the second word line.

DETAILED DESCRIPTION

Figure 1:
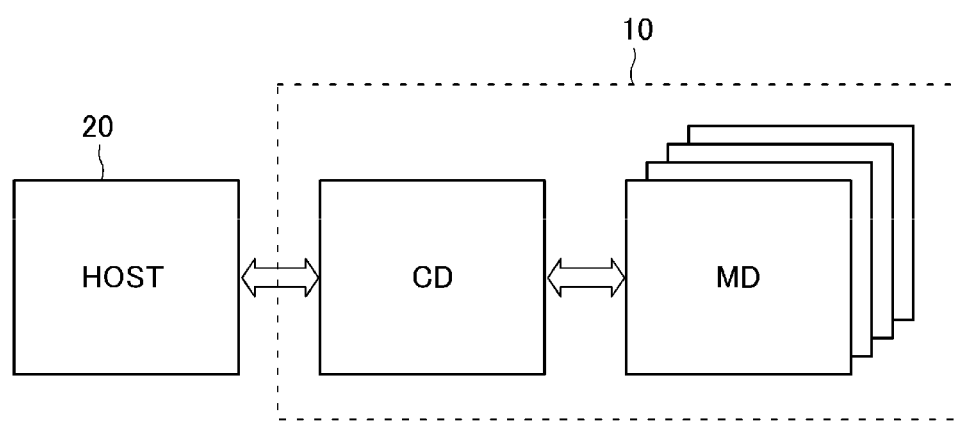
FIG. 1 is a schematic block diagram illustrating a configuration of a memory system according to a first embodiment.

Embodiments provide a semiconductor storage device that facilitates high density integration.

In general, according to one embodiment, a semiconductor storage device includes a first semiconductor substrate, a second semiconductor substrate, a first memory cell and a second memory cell provided between the first semiconductor substrate and the second semiconductor substrate, a first word line electrically connected to the first memory cell, a second word line electrically connected to the second memory cell, a first transistor that is provided on the first semiconductor substrate and electrically connected between the first word line and a first wiring through which a voltage is applied to the first word line, and a second transistor that is provided on the second semiconductor substrate and electrically connected between the second word line and a second wiring through which a voltage is applied to the second word line.

Then, a semiconductor storage device according to embodiments will be described in detail with reference to the drawings. The following embodiments are merely examples, and are not intended to limit the present disclosure. The following drawings are schematic, and some configurations and the like may be omitted for the sake of convenience in description. Common portions in a plurality of embodiments are denoted by the same reference signs, and repetitive description thereof may be omitted.

The term "semiconductor storage device" used in the present specification may mean a memory die, or a memory system including a controller die, such as a memory chip, a memory card, or a solid state drive (SSD). The term "semiconductor storage device" may mean a configuration that includes a host computer such as a smartphone, a tablet terminal, and a personal computer.

In the present specification, when a first component is said to be "electrically connected" to a second component, the first component may be directly connected to the second component, or the first component maybe connected to the second component via a wiring, a semiconductor member, a transistor, or the like. For example, when three transistors are connected in series, the first transistor is "electrically connected" to the third transistor even though the second transistor is in an OFF state.

In the present specification, a case where the first component is said to be "connected between" the second component and the third component may mean that the first component, the second component, and the third component are connected in series and the second component is connected to the third component via the first component.

In the present specification, a case where a circuit or the like is said to "cause two wirings and the like to be electrically connected" may mean, for example, that the circuit or the like includes a transistor and the like, the transistor and the like are provided on a current path between the two wirings and the like, and the transistor and the like transition into an ON state.

In the present specification, a predetermined direction parallel to an upper surface of a semiconductor substrate is referred to as an X direction, a direction which is parallel to the upper surface of the semiconductor substrate and is perpendicular to the X direction is referred to as a Y direction, and a direction perpendicular to the upper surface of the semiconductor substrate is referred to as a Z direction.

In the present specification, a direction along a predetermined surface is referred to as a first direction, a direction intersecting the first direction along the predetermined surface is referred to as a second direction, and a direction intersecting the predetermined surface is referred to as a third direction. The first direction, the second direction, and the third direction may or may not correspond to any of the X direction, the Y direction, and the Z direction.

When expressions such as "upper" and "lower" are used in the present specification, for example, among two semiconductor substrates included in a memory die, one provided with a bonding pad electrode may be defined as the upper semiconductor substrate, and the other not provided with the bonding pad electrode may be defined as the lower semiconductor substrate. When components included in the memory die are described, for example, a direction towards the upper semiconductor substrate along the Z direction may be referred to as being upward, and a direction towards the lower semiconductor substrate along the Z direction may be referred to as being downward. A case where a lower surface and a lower end of a certain component are described may mean a surface and an end portion of the component on the lower semiconductor substrate side. A case where an upper surface and an upper end of a certain component are described may mean a surface and an end portion of the component on the upper semiconductor substrate side. A surface intersecting the X direction or the Y direction may be referred to as a side surface or the like.

First Embodiment

Memory System 10

FIG. 1 is a schematic block diagram illustrating a configuration of a memory system 10 according to a first embodiment.

The memory system 10, for example, reads, writes, and erases user data in accordance with a signal transmitted from a host computer 20. The memory system 10 is, for example, a memory chip, a memory card, an SSD, or other systems capable of storing user data. The memory system 10 includes a plurality of memory dies MD and a controller die CD. The memory die MD stores user data. The controller die CD is connected to the plurality of memory dies MD and the host computer 20. The controller die CD includes a processor, and a RAM, for example. The controller die CD performs processing such as conversion between a logical address and a physical address, bit error detection/correction, garbage collection (compaction), and wear leveling.

Figure 2:
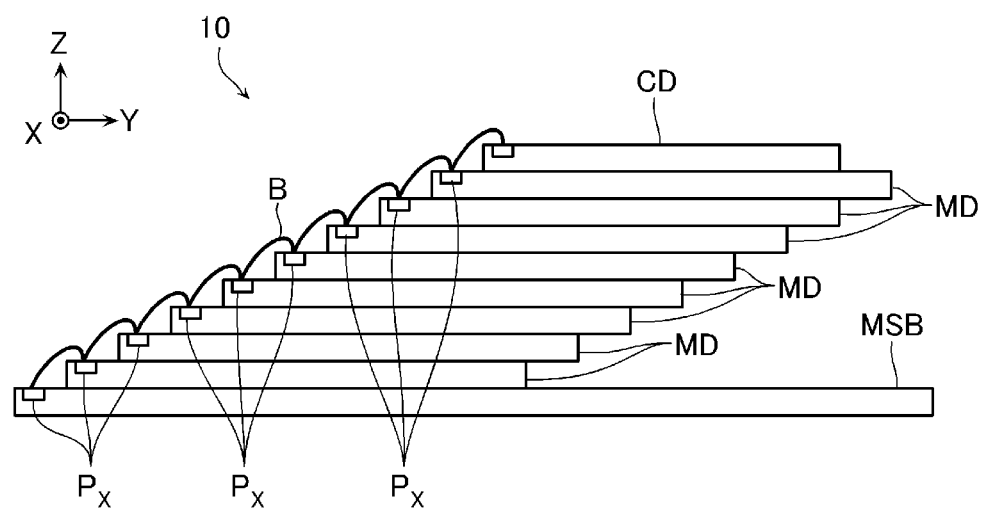
FIG. 2 is a side view schematically illustrating an example of the configuration of the memory system.
Figure 3:
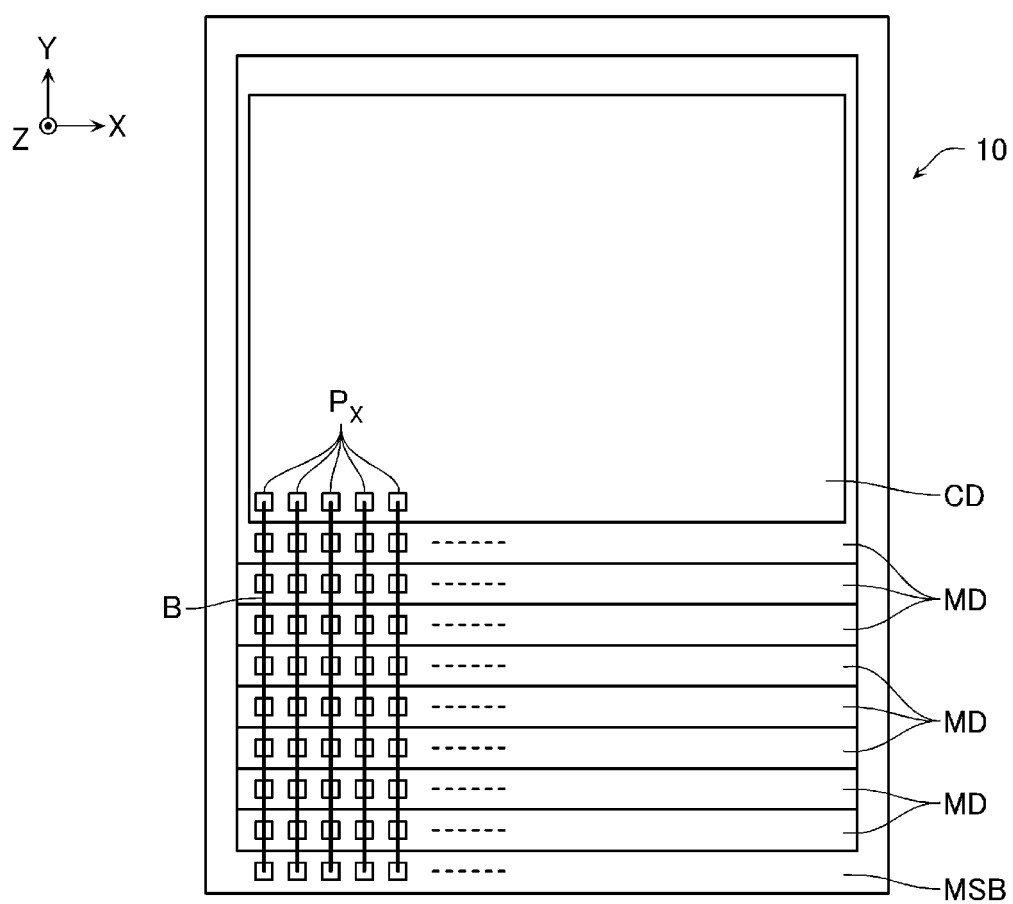
FIG. 3 is a plan view schematically illustrating the example of the configuration of the memory system.

FIG. 2 is a side view schematically illustrating an example of the configuration of the memory system 10 according to the first embodiment. FIG. 3 is a plan view schematically illustrating the example of the configuration. For convenience of description, illustrations of some components are omitted in FIGS. 2 and 3.

As illustrated in FIG. 2, the memory system 10 according to the present embodiment includes a mounting substrate MSB, a plurality of memory dies MD, and a controller die CD. A bonding pad electrode $P_X$ is provided in a region of an end portion of the upper surface of the mounting substrate MSB in the Y direction. A region of the upper surface of the mounting substrate MSB other than the end portion in the Y direction is adhered to the lower surface of the memory die MD via an adhesive or the like. A plurality of memory dies MD is stacked on the mounting substrate MSB. A bonding pad electrode $P_X$ is provided in the region of the end portion in the Y direction of the upper surface of the memory die MD. A region of the upper surface of the memory die MD other than the end portion in the Y direction is adhered to the lower surface of another memory die MD or the lower surface of the controller die CD via an adhesive or the like. The controller die CD is stacked on the memory die MD. A bonding pad electrode $P_X$ is provided in a region of an end portion of the upper surface of the controller die CD in the Y direction.

As illustrated in FIG. 3, each of the mounting substrate MSB, the plurality of memory dies MD, and the controller die CD includes a plurality of bonding pad electrodes $P_X$ arranged in the X direction. The plurality of bonding pad electrodes $P_X$ provided on the mounting substrate MSB, the plurality of memory dies MD, and the controller die CD are connected to each other via bonding wires B.

The components illustrated in FIGS. 2 and 3 are merely an example, and the specific components may be adjusted as appropriate. For example, in the example illustrated in FIGS. 2 and 3, the controller die CD is stacked on the plurality of memory die MD. The memory die MD and the controller die CD are connected by a bonding wire B. The plurality of memory dies MD and the controller die CDs are included in one package. However, the controller die CD may be included in a package different from the memory die MD.

Circuit Configuration of Memory Die MD

Figure 4:
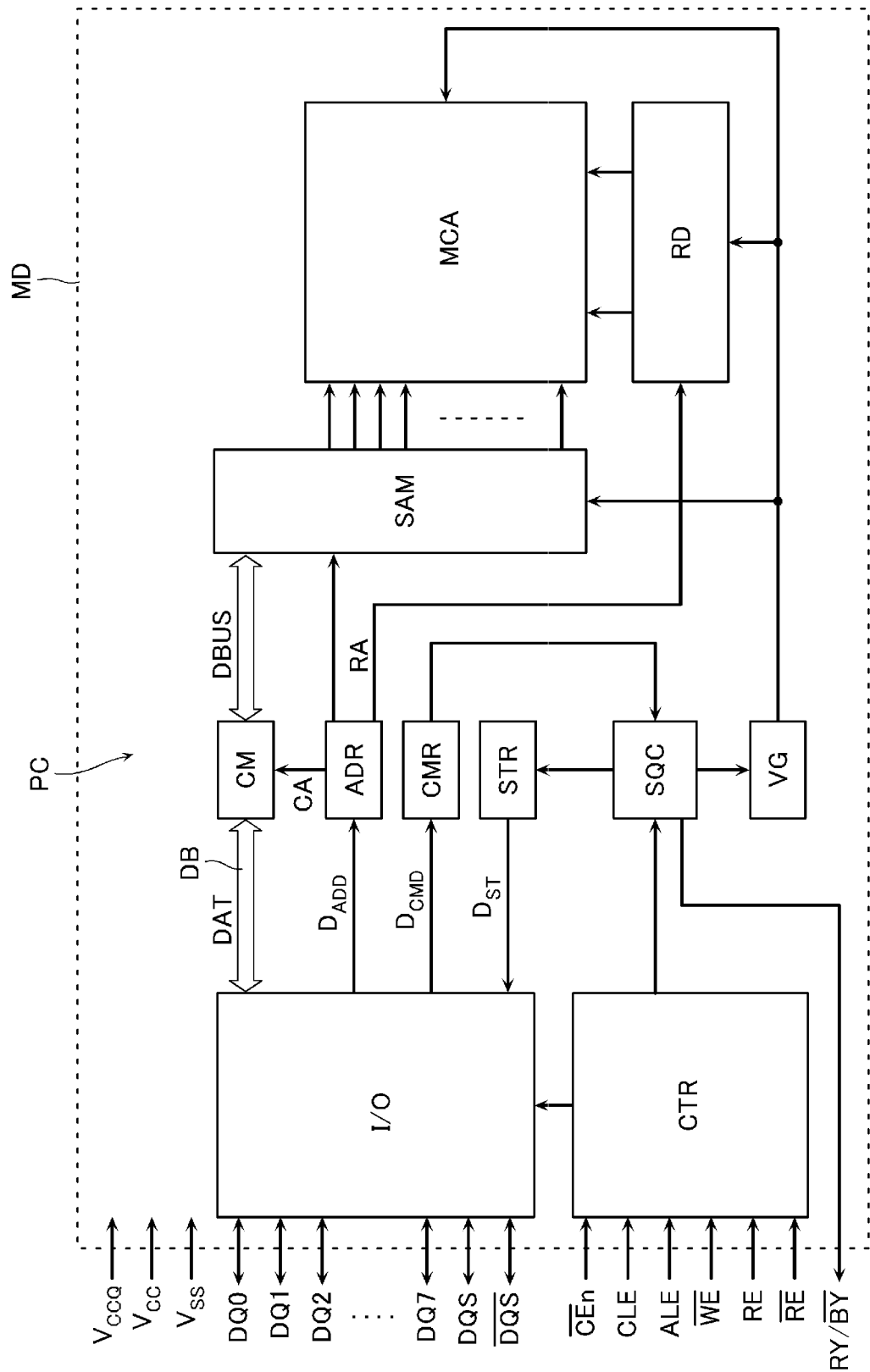
FIG. 4 is a schematic block diagram illustrating an example of a configuration of a memory die.
Figure 5:
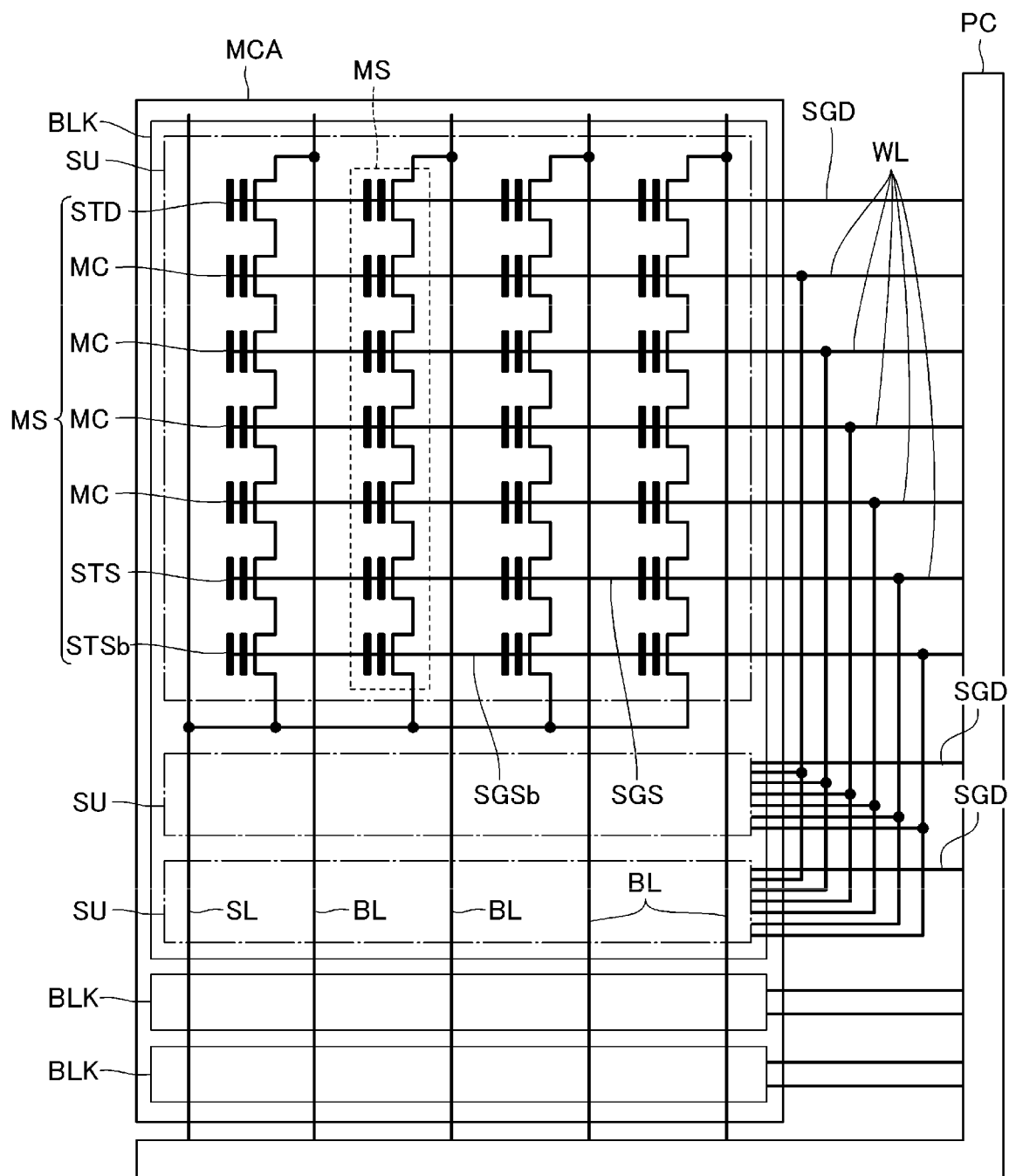
FIG. 5 is a schematic circuit diagram illustrating a circuit configuration of a portion of the memory die.
Figure 6:
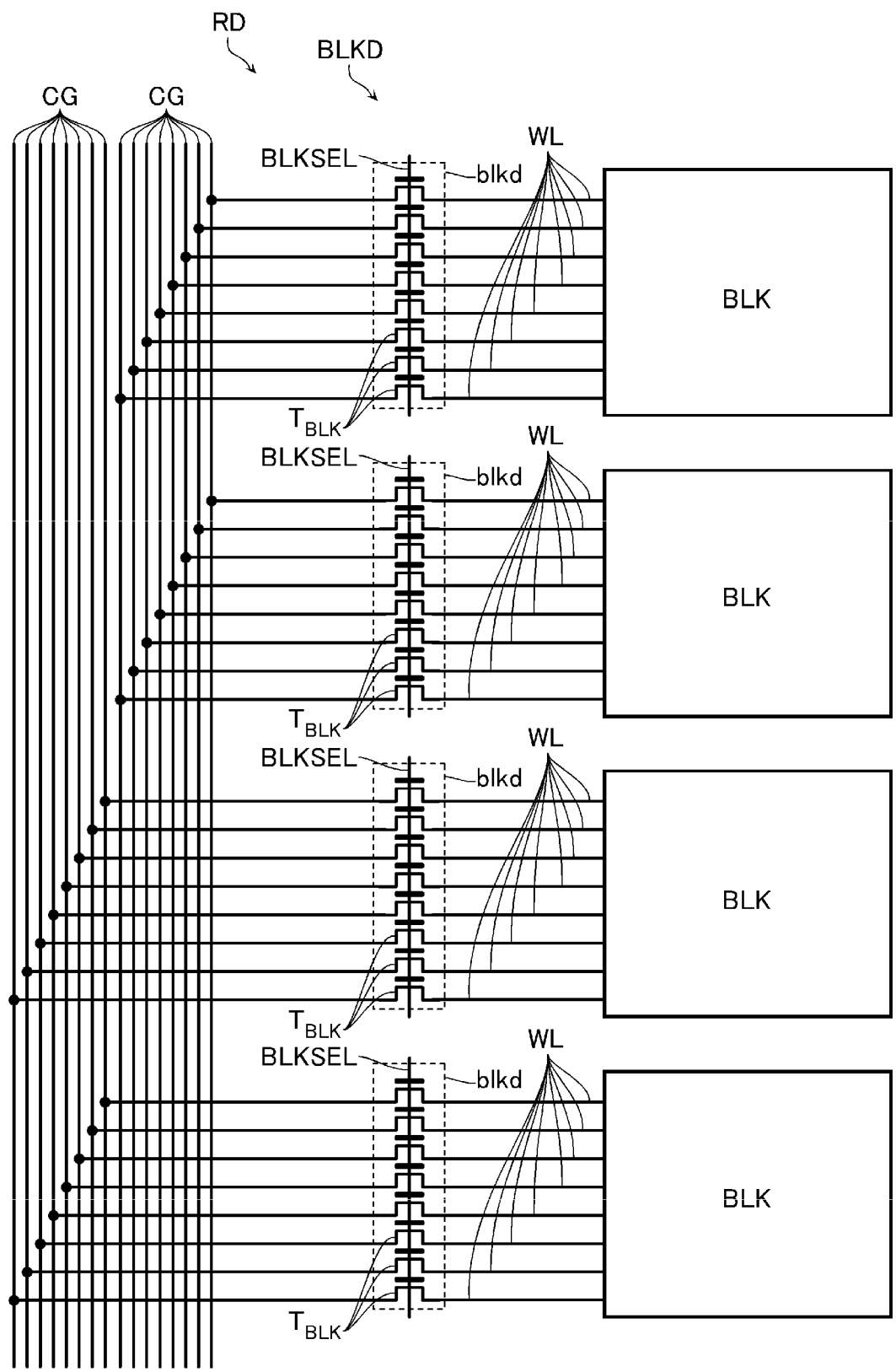
FIG. 6 is a schematic circuit diagram illustrating a circuit configuration of another portion of the memory die.

FIG. 4 is a schematic block diagram illustrating an example of the configuration of the memory die MD according to a first embodiment. FIGS. 5 and 6 are schematic circuit diagrams illustrating a partial configuration of the memory die MD.

FIG. 4 illustrates a plurality of control terminals and the like. The plurality of control terminals may be represented as control terminals corresponding to a high active signal (positive logic signal). The plurality of control terminals may be represented as control terminals corresponding to a low active signal (negative logic signal). The plurality of control terminals may be represented as control terminals corresponding to both the high active signal and the low active signal. In FIG. 4, the reference sign of the control terminal corresponding to the low active signal includes an overline. In the present specification, the reference sign of the control terminal corresponding to the low active signal includes a slash ("/"). The illustration of FIG. 4 is an example, and the specific form may be adjusted as appropriate. For example, some or all of high active signals may be set to low active signals, or some or all of low active signals may be set to high active signals.

As illustrated in FIG. 4, the memory die MD includes a memory cell array MCA and a peripheral circuit PC. The peripheral circuit PC includes a voltage generation circuit VG, a row decoder RD, a sense amplifier module SAM, and a sequencer SQC. The peripheral circuit PC further includes a cache memory CM, an address register ADR, a command register CMR, and a status register STR. The peripheral circuit PC further includes an input/output control circuit I/O and a logic circuit CTR.

Circuit Configuration of Memory Cell Array MCA

As illustrated in FIG. 5, the memory cell array MCA includes a plurality of memory blocks BLK. Each of the plurality of memory blocks BLK includes a plurality of string units SU. Each of the plurality of string units SU includes a plurality of memory strings MS. One end of each of the plurality of memory strings MS is connected to the peripheral circuit PC via a bit line BL. The other end of each of the plurality of memory strings MS is connected to the peripheral circuit PC via a common source line SL.

The memory string MS includes a drain-side select transistor STD, a plurality of memory cells (memory transistors) MC, a source-side select transistor STS, and a source-side select transistor STSb. The drain-side select transistor STD, the plurality of memory cells MC, the source-side select transistor STS, and the source-side select transistor STSb are connected in series between the bit line BL and the source line SL. The drain-side select transistor STD, the source-side select transistor STS, and the source-side select transistor STSb may be simply referred below to as select transistors (STD, STS, and STSb).

The memory cell MC is a field effect transistor. The memory cell MC includes a semiconductor layer, a gate insulating film, and a gate electrode. The semiconductor layer functions as a channel region. The gate insulating film includes a charge storage film. The threshold voltage of the memory cell MC changes depending on the charge quantity in the charge storage film. The memory cell MC stores data of one bit or a plurality of bits. A word line WL is connected to each of the gate electrodes of the plurality of memory cells MC corresponding to one memory string MS. Each word line WL is commonly connected across all memory strings MS in one memory block BLK.

The select transistors (STD, STS, and STSb) are field effect transistors. Each of the select transistors (STD, STS, and STSb) includes a semiconductor layer, a gate insulating film, and a gate electrode. The semiconductor layer functions as a channel region. Selection gate lines (SGD, SGS, and SGSb) are connected to gate electrodes of the select transistors (STD, STS, and STSb), respectively. One drain-side selection gate line SGD is commonly connected across all memory strings MS in one string unit SU. One source-side selection gate line SGS is commonly connected across all memory strings MS in one memory block BLK. One source-side selection gate line SGSb is commonly connected across all memory strings MS in one memory block BLK.

Circuit Configuration of Voltage Generation Circuit VG

The voltage generation circuit VG (FIG. 4) includes, for example, a step-down circuit and a step-up circuit. The step-down circuit is, for example, a regulator. The step-up circuit is, for example, a charge pump circuit. Each of the step-down circuit and the step-up circuit is connected to a power-source voltage supply line. A power-source voltage $V_{CC}$ and a ground voltage $V_{SS}$ are supplied to the power-source voltage supply line. The power-source voltage supply line is connected to, for example, the bonding pad electrode $P_X$ described with reference to FIGS. 2 and 3. The voltage generation circuit VG generates a plurality of operation voltages and simultaneously outputs the generated operation voltages to a plurality of voltage supply lines, respectively. The plurality of operation voltages are supplied to the bit line BL, the source line SL, the word line WL, and the selection gate lines (SGD, SGS, and SGSb), for example, during a read operation, a write operation, and an erasing operation on the memory cell array MCA. The operation voltage is appropriately adjusted in accordance with a control signal from the sequencer SQC.

Circuit Configuration of Row Decoder RD

The row decoder RD includes a block decoder BLKD, for example, as illustrated in FIG. 6.

The block decoder BLKD includes a plurality of block decoding units blkd. The plurality of block decoding units blkd are provided respectively for the plurality of memory blocks BLK in the memory cell array MCA. The block decoding unit blkd includes a plurality of transistors $T_{BLK}$. The plurality of transistors $T_{BLK}$ are provided respectively for the plurality of word lines WL in the memory block BLK. The transistor $T_{BLK}$ is, for example, a field effect type NMOS transistor. The drain electrode of the transistor $T_{BLK}$ is connected to the word line WL. The source electrode of the transistor $T_{BLK}$ is connected to a wiring CG. The wiring CG is connected to a plurality of block decoding units blkd in the block decoder BLKD. For example, each wiring CG may be connected to the source electrode of one transistor $T_{BLK}$ in all the block decoding units blkd in the block decoder BLKD. The gate electrode of the transistor $T_{BLK}$ is connected to a signal supply line BLKSEL. A plurality of signal supply lines BLKSEL are provided respectively for the block decoding units blkd. The signal supply line BLKSEL is connected to all the transistors $T_{BLK}$ in the block decoding unit blkd.

In a read operation, a write operation, and the like, for example, one signal supply line BLKSEL corresponding to a row address RA included in address data $D_{ADD}$ stored in the address register ADR (FIG. 4) is in an "H" state, and other signal supply lines BLKSEL are in an "L" state. For example, a predetermined drive voltage having a positive magnitude is supplied to the one signal supply line BLKSEL, and a ground voltage $V_{SS}$ or the like is supplied to other signal supply lines BLKSEL. Thus, all the word lines WL in one memory block BLK corresponding to the row address RA are electrically connected respectively to all the wirings CG. In addition, all the word lines WL in the other memory blocks BLK are in a floating state.

The row decoder RD further includes a decoding circuit (not illustrated) and a switch circuit (not illustrated).

For example, the decoding circuit (not illustrated) sequentially decodes the row address RA in accordance with the control signal from the sequencer SQC (FIG. 4), selectively sets one of the plurality of signal supply lines BLKSEL to be in the "H" state, and sets others to be in the "L" state. The switch circuit supplies a plurality of voltages output from the voltage generation circuit VG to the desired wiring CG in accordance with output signals of the decoding circuit and the sequencer SQC.

Circuit Configuration of Sense Amplifier Module SAM

The sense amplifier module SAM (FIG. 4) includes, for example, a plurality of sense amplifiers. The sense amplifier includes a sense transistor, a data wiring, a latch circuit, and a voltage transfer circuit. The gate electrode of the sense transistor is connected to the bit line BL. The drain electrode of the sense transistor is connected to the data wiring. The sense transistor transitions into the ON state in accordance with the voltage or the current of the bit line BL. The data wiring is charged or discharged in accordance with the ON/OFF state of the sense transistor. The latch circuit latches data of "1" or "0" in accordance with the voltage of the data wiring. The voltage transfer circuit causes the bit line BL to be electrically connected to one of the two voltage supply lines in accordance with the data latched by the latch circuit.

Circuit Configuration of Cache Memory CM

The cache memory CM (FIG. 4) includes a plurality of latch circuits. The plurality of latch circuits are connected to the latch circuit in the sense amplifier module SAM via a wiring DBUS. Pieces of data DAT included in the plurality of latch circuits are sequentially transferred to the sense amplifier module SAM or the input/output control circuit I/O.

A decoding circuit (not illustrated) and a switch circuit (not illustrated) are connected to the cache memory CM. The decoding circuit decodes a column address CA included in the address data $D_{ADD}$ stored in the address register ADR (FIG. 4). The switch circuit causes the latch circuit corresponding to the column address CA to be electrically connected to a bus DB in accordance with the output signal of the decoding circuit.

Circuit Configuration of Sequencer SQC

The sequencer SQC (FIG. 4) outputs an internal control signal to the row decoder RD, the sense amplifier module SAM, and the voltage generation circuit VG in accordance with command data $D_{CMD}$ stored in the command register CMR. The sequencer SQC outputs status data $D_{ST}$ indicating the state of the sequencer itself to the status register STR as appropriate.

The sequencer SQC generates a ready/busy signal and outputs the generated ready/busy signal to a terminal RY//BY. During a period (busy period) in which the terminal RY//BY is in the "L" state, an access to the memory die MD is basically prohibited. During a period (ready period) in which the terminal RY//BY is in the "H" state, the access to the memory die MD is permitted. The terminal RY//BY is implemented, for example, by the bonding pad electrode $P_X$ described with reference to FIGS. 2 and 3.

Circuit Configuration of Input/output Control Circuit I/O

The input/output control circuit I/O includes data signal input/output terminals DQ0 to DQ7, toggle signal input/output terminals DQS/DQS, a plurality of input circuits, a plurality of output circuits, a shift register, and a buffer circuit. The plurality of input circuits, the plurality of output circuits, the shift register, and the buffer circuit are connected to terminals to which the power-source voltage $V_{CCQ}$ and the ground voltage $V_{SS}$ are supplied, respectively.

The data signal input/output terminals DQ0 to DQ7, the toggle signal input/output terminals DQS/DQS, and the terminals to which the power-source voltage $V_{CCQ}$ are supplied are implemented, for example, by the bonding pad electrodes $P_X$ described with reference to FIGS. 2 and 3. Data input via the data signal input/output terminals DQ0 to DQ7 is output from the buffer circuit to the cache memory CM, the address register ADR, or the command register CMR in accordance with the internal control signal from the logic circuit CTR. Data output via the data signal input/output terminals DQ0 to DQ7 is input to the buffer circuit from the cache memory CM or the status register STR in accordance with the internal control signal from the logic circuit CTR.

Circuit Configuration of Logic Circuit CTR

The logic circuit CTR receives an external control signal from the controller die CD via external control terminals /CEn, CLE, ALE, /WE, RE, and /RE, and outputs the internal control signal to the input/output control circuit I/O in response to the reception. The external control terminals /CEn, CLE, ALE, /WE, RE, and /RE are implemented, for example, by the bonding pad electrodes $P_X$ described with reference to FIGS. 2 and 3.

Structure of Memory Die MD

Figure 7:
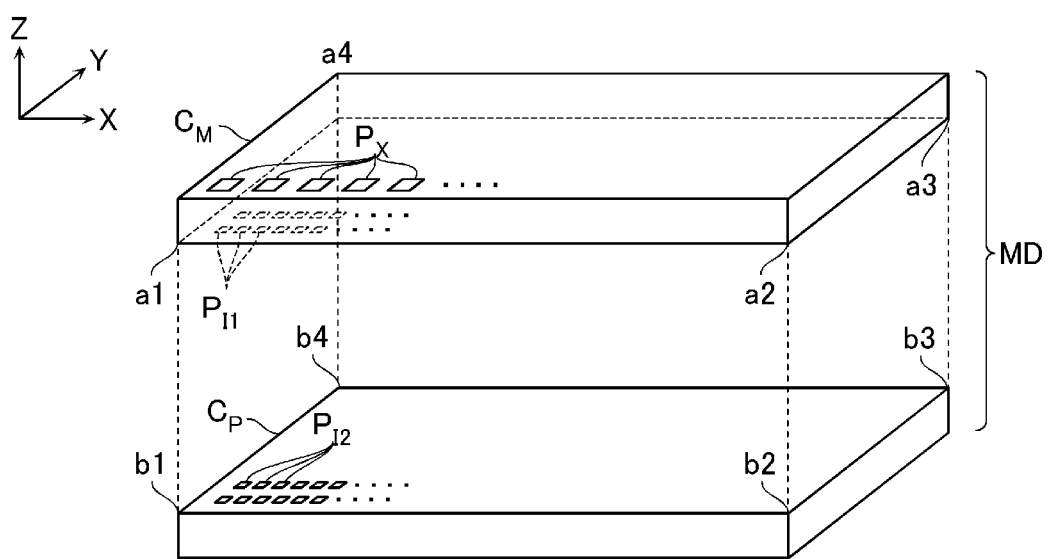
FIG. 7 is an exploded perspective view schematically illustrating two chips of the memory die.
Figure 8:
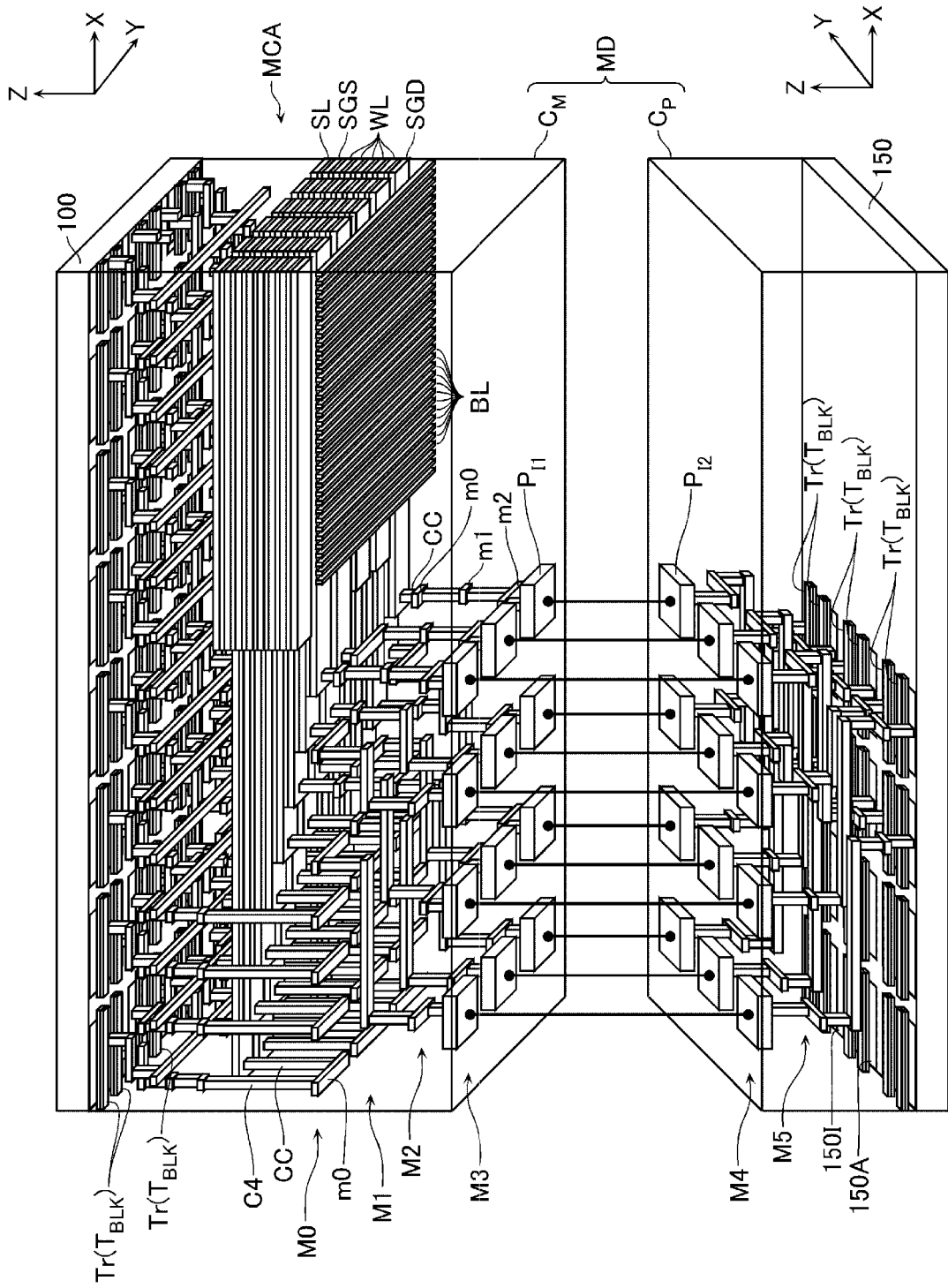
FIG. 8 is an exploded perspective view schematically illustrating transistors and wiring layers in the example of the configuration of the memory die.

FIGS. 7 and 8 are exploded perspective views schematically illustrating the example of the configuration of the memory die MD. In FIG. 8, illustrations of the configuration of the transistor and the like are omitted in a partial region of the upper surface of a semiconductor substrate 150. In this region, the configuration of the transistor and the like may be arranged in a complicated pattern.

As illustrated in FIG. 7, the memory die MD includes a chip $C_M$ and a chip $C_P$. The plurality of bonding pad electrodes $P_X$ are provided on the upper surface of the chip $C_M$. As illustrated in FIG. 8, the chip $C_M$ includes a semiconductor substrate 100, a plurality of transistors Tr provided on the lower surface of the semiconductor substrate 100, the memory cell array MCA provided below the transistors Tr, and a plurality of first bonding electrodes $P_{I1}$ provided on the lower surface of the chip $C_M$. The chip $C_P$ includes the semiconductor substrate 150, a plurality of transistors Tr provided on the upper surface of the semiconductor substrate 150, and a plurality of second bonding electrodes $P_{I2}$ provided on the upper surface of the chip $C_P$. The memory cell array MCA and the plurality of transistors Tr in the chip $C_M$ are electrically connected to the plurality of transistors Tr in the chip $C_P$ via the plurality of first bonding electrodes $P_{I1}$ and the plurality of second bonding electrodes $P_{I2}$. The plurality of transistors Tr provided in the chip $C_M$ and the chip $C_P$ function as a portion of the peripheral circuit PC (FIG. 4).

In the chips $C_M$ and $C_P$, a surface on which the plurality of first bonding electrodes $P_{I1}$ or the plurality of second bonding electrodes $P_{I2}$ are provided is referred below to as a front surface, and a surface opposite to the front surface is referred below to as a rear surface.

The chip $C_M$ and the chip $C_P$ are disposed so that the front surface of the chip $C_M$ faces the front surface of the chip $C_P$. The plurality of first bonding electrodes $P_{I1}$ are provided respectively corresponding to the plurality of second bonding electrodes $P_{I2}$, and are arranged at locations bondable to the plurality of second bonding electrodes $P_{I2}$. The first bonding electrodes $P_{I1}$ and the second bonding electrodes $P_{I2}$ function as bonding electrodes for bonding the chip $C_M$ and the chip $C_P$ to each other and causing the chip $C_M$ and the chip $C_P$ to be electrically connected to each other.

In the example of FIG. 7, corners a1, a2, a3, and a4 of the chip $C_M$ correspond to corners b1, b2, b3, and b4 of the chip $C_P$, respectively.

Structure of Chip $C_M$

Figure 9:
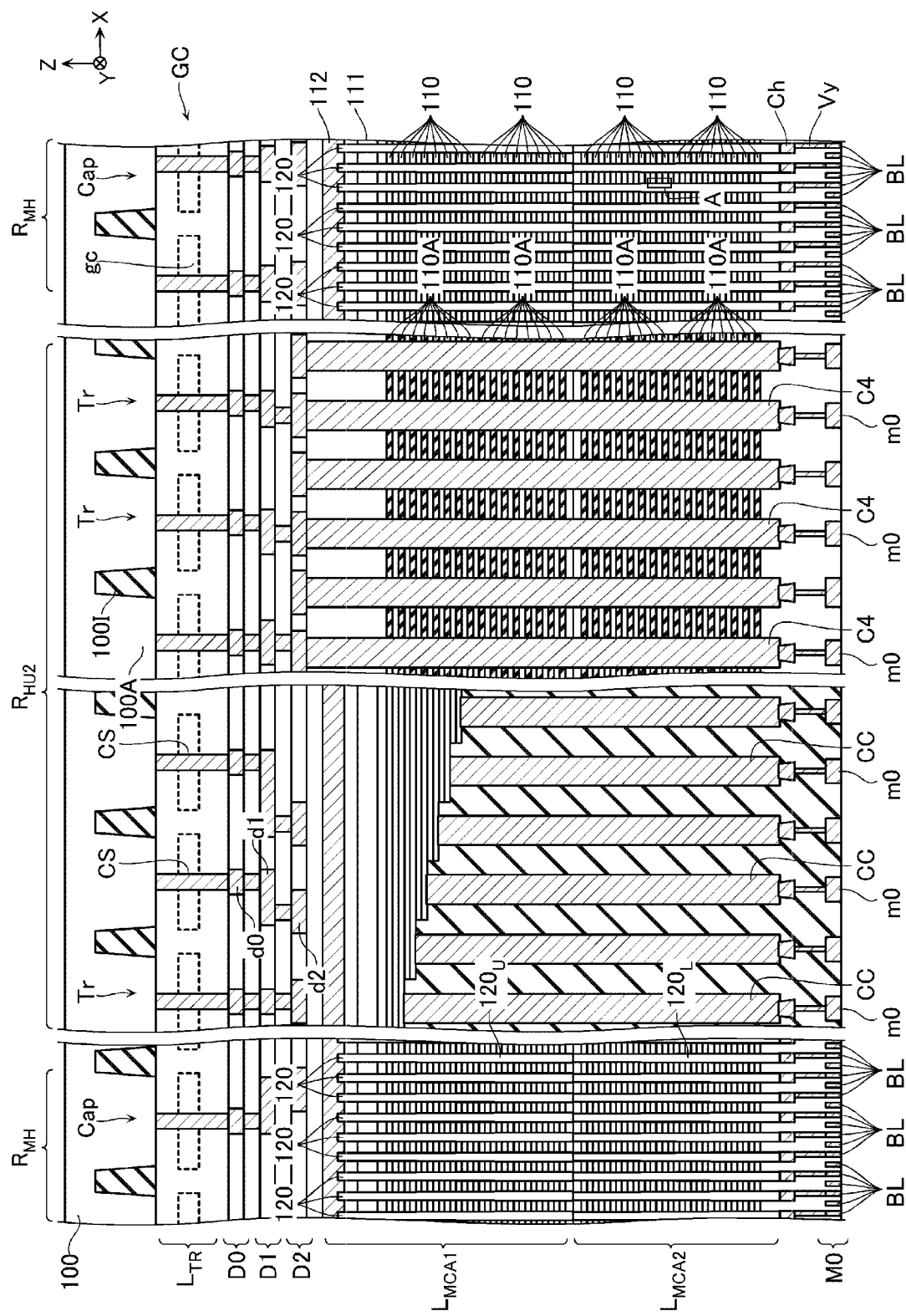
FIG. 9 is a cross-sectional view schematically illustrating a first chip of the memory die.
Figure 10:
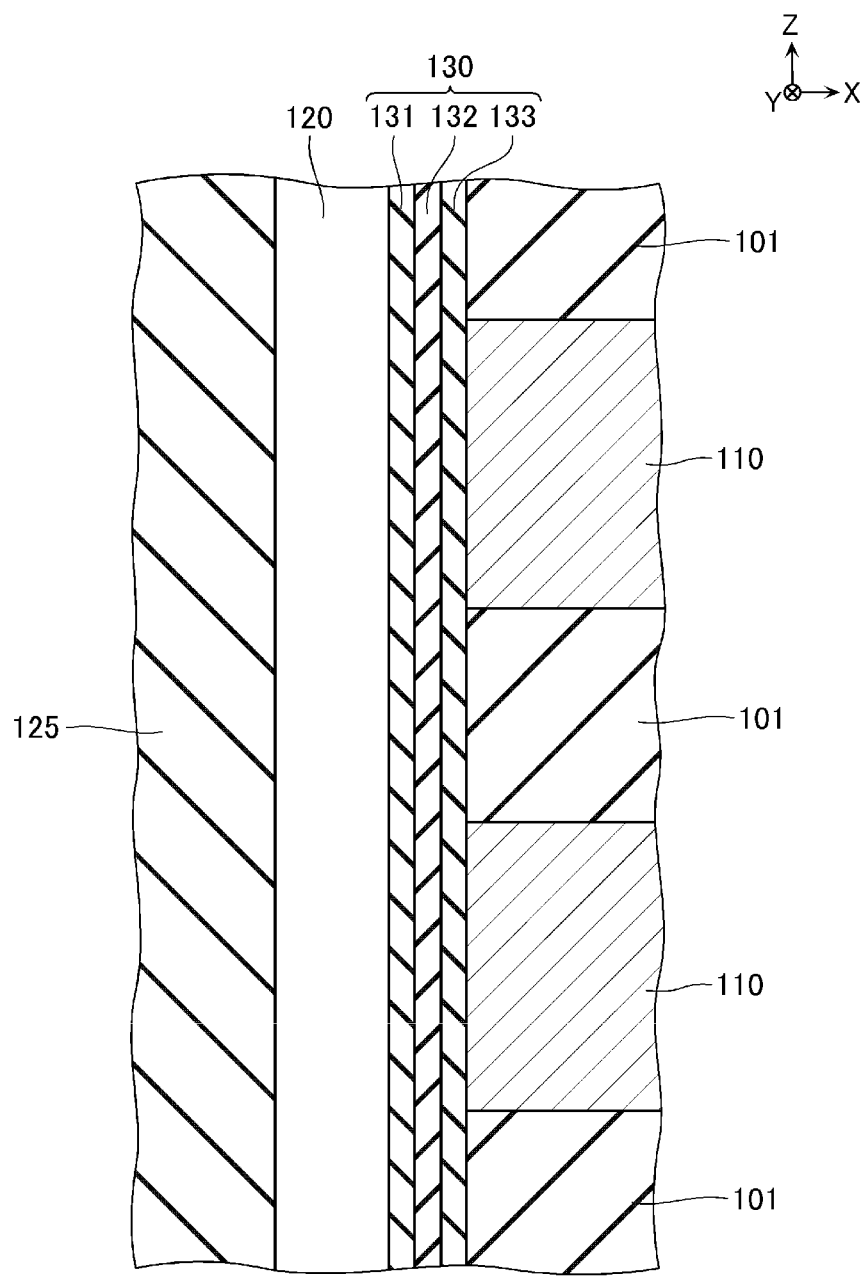
FIG. 10 is an enlarged view schematically illustrating a portion of the first chip indicated by A in FIG. 9.
Figure 11:
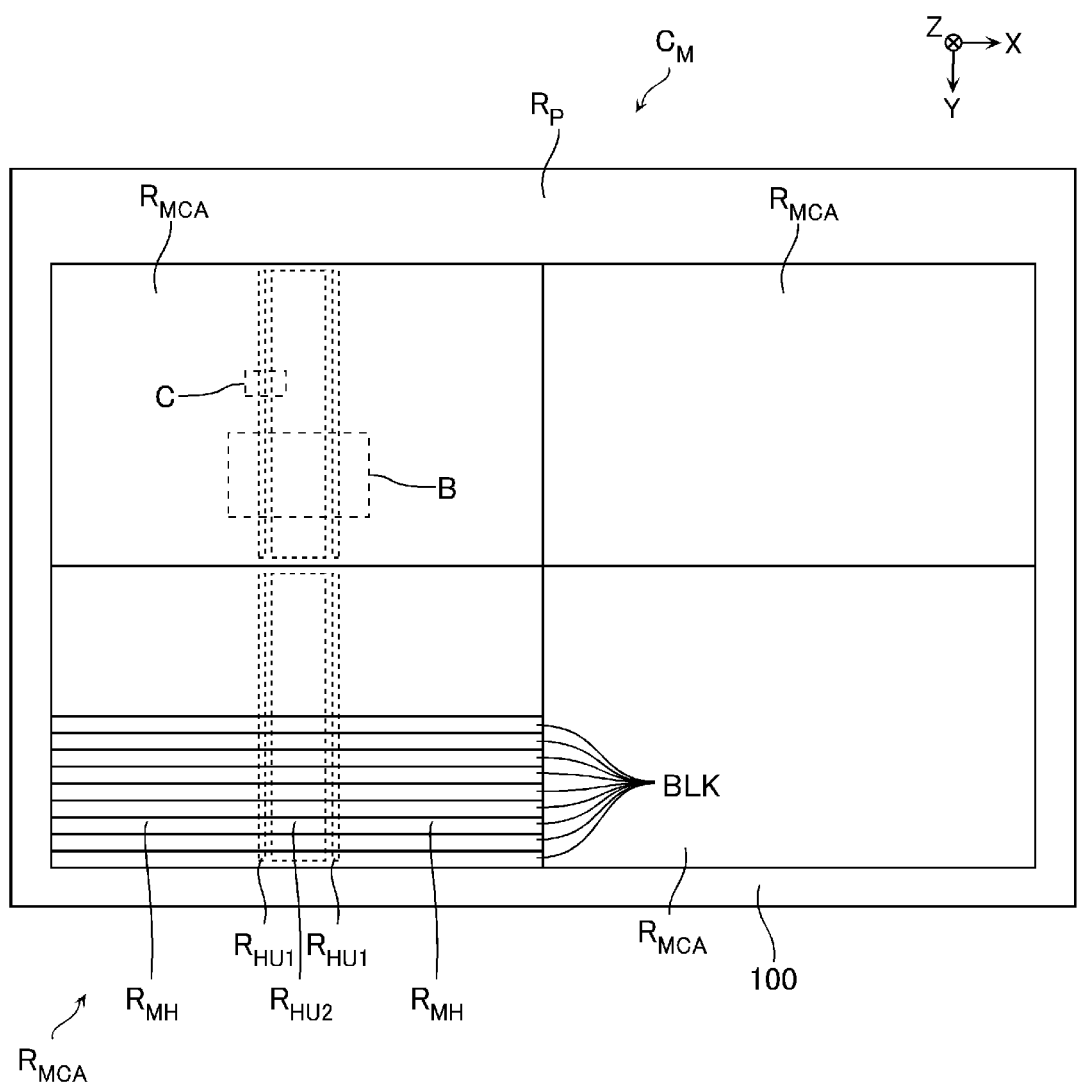
FIG. 11 is a bottom view schematically illustrating the first chip.
Figure 12:
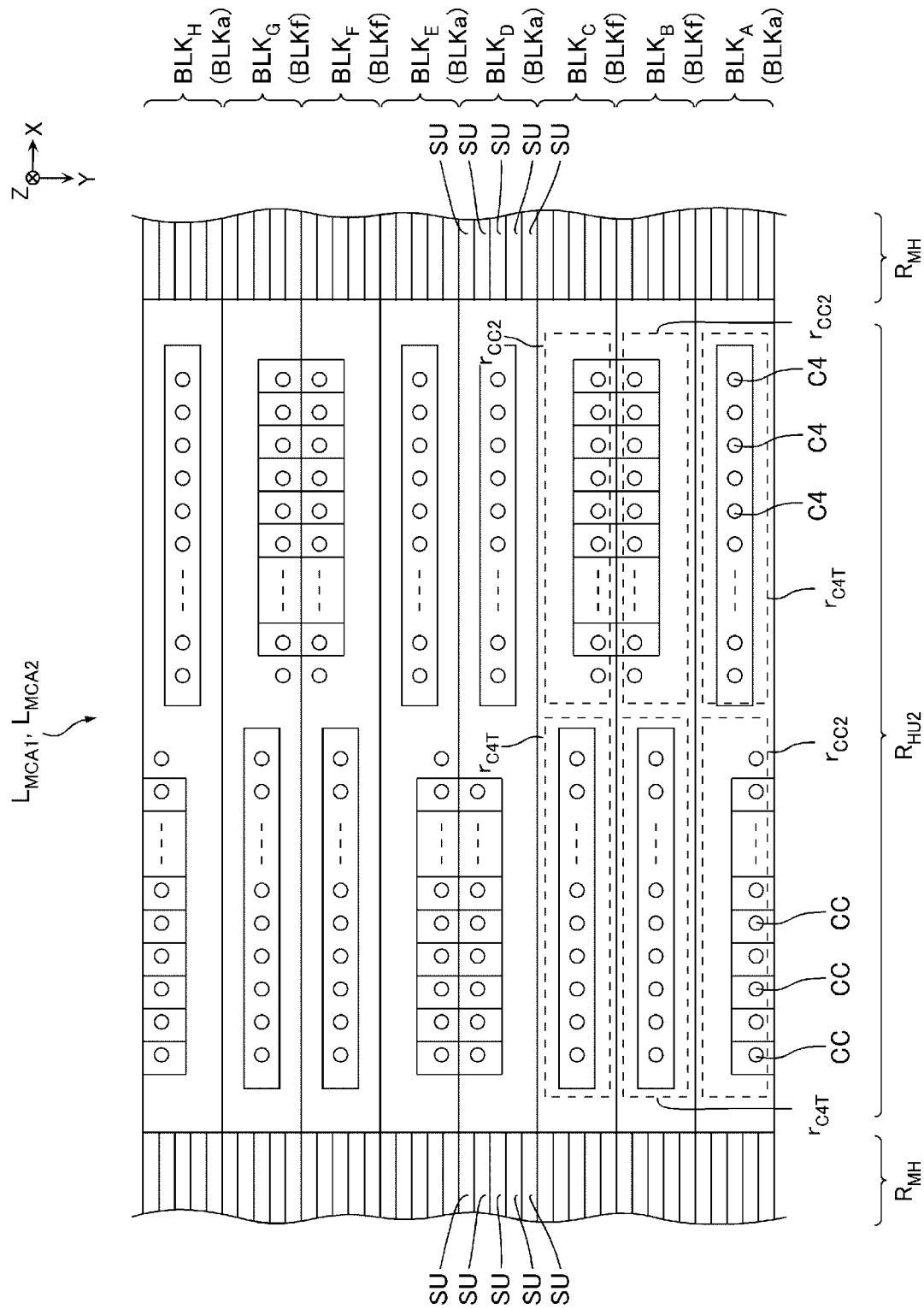
FIG. 12 is an enlarged view schematically illustrating a portion of the first chip indicated by B in FIG. 11.
Figure 13:
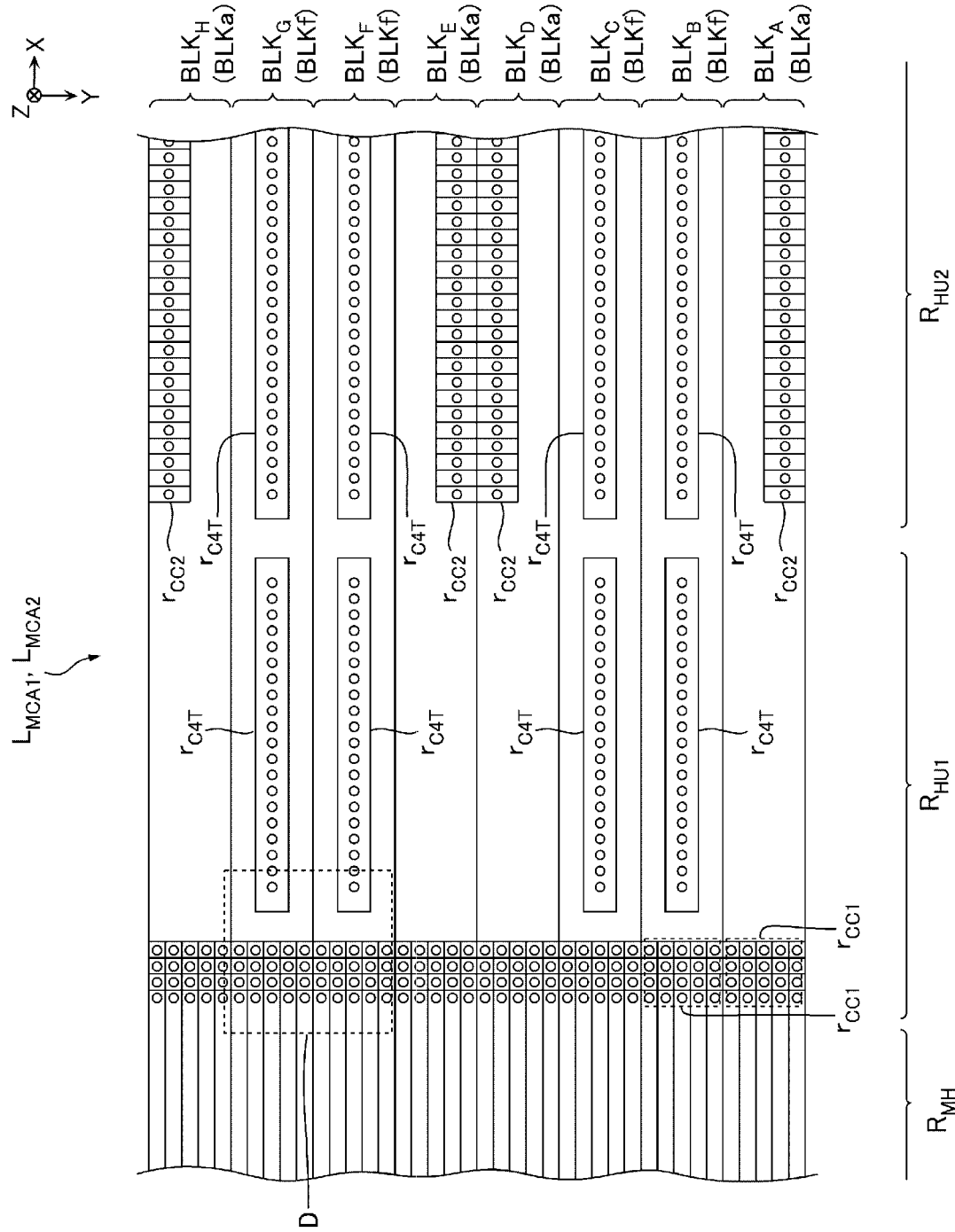
FIG. 13 is an enlarged view schematically illustrating a portion of the first chip indicated by C in FIG. 11.
Figure 14:
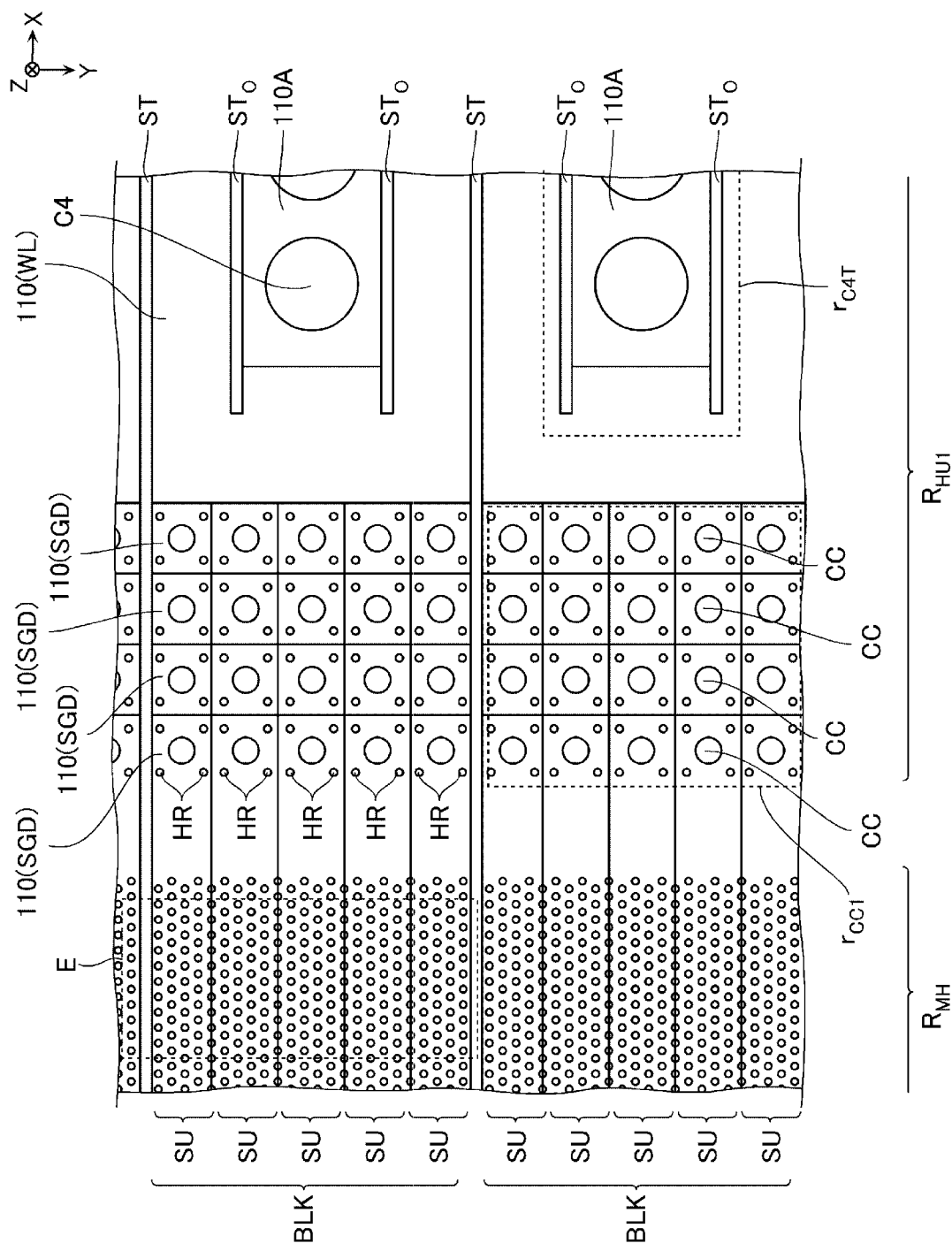
FIG. 14 is an enlarged view schematically illustrating a portion of the first chip indicated by D in FIG. 13.
Figure 15:
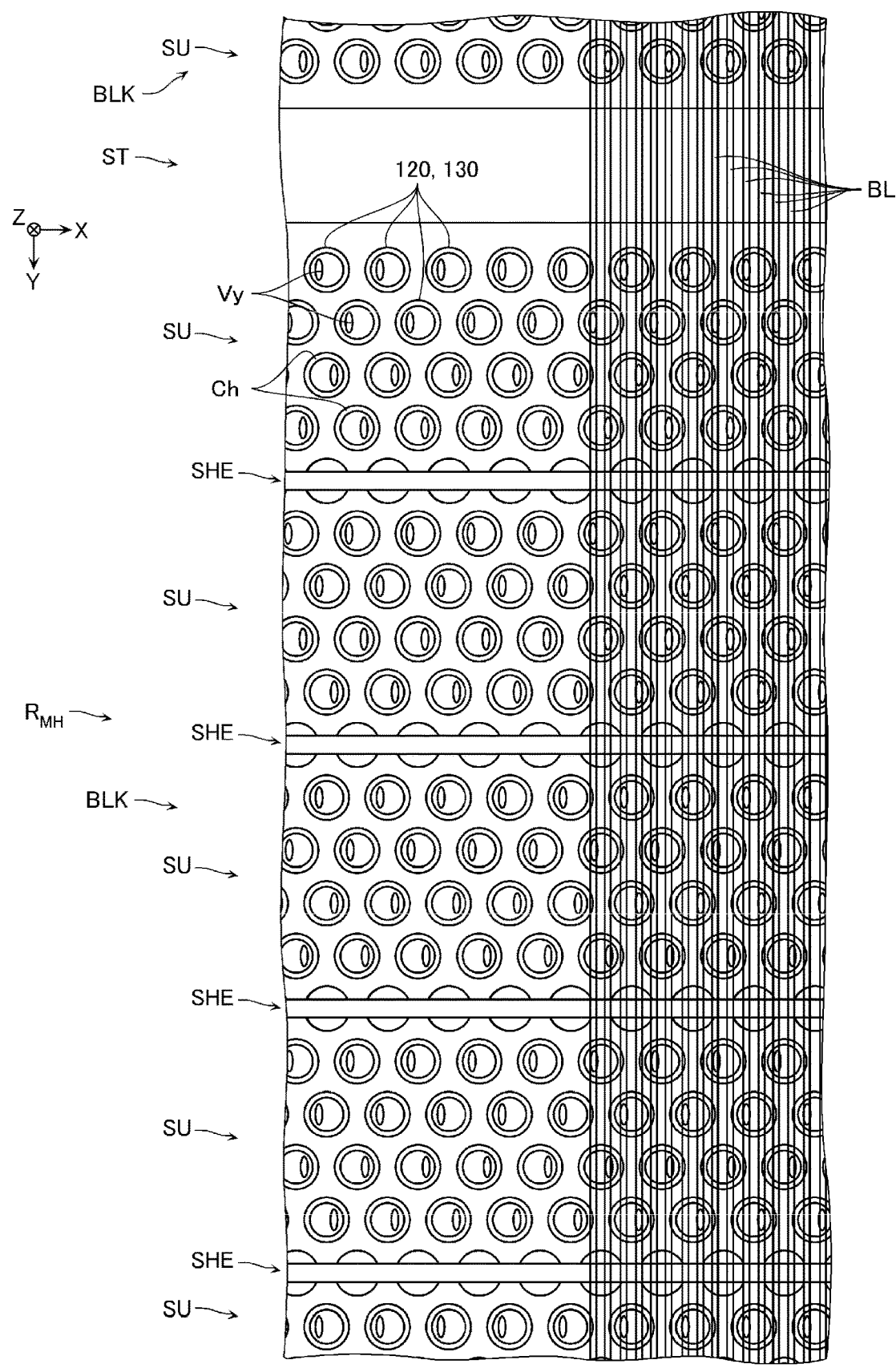
FIG. 15 is an enlarged view schematically illustrating a portion of the first chip indicated by E in FIG. 14.

FIG. 9 is a cross-sectional view schematically illustrating the chip $C_M$. FIG. 10 is an enlarged view schematically illustrating a portion of the chip $C_M$ indicated by A in FIG. 9. FIG. 11 is a bottom view schematically illustrating the chip $C_M$. FIG. 12 is an enlarged view schematically illustrating a portion of the chip $C_M$ indicated by B in FIG. 11. FIG. 13 is an enlarged view schematically illustrating a portion of the chip $C_M$ indicated by C in FIG. 11. FIG. 14 is an enlarged view schematically illustrating a portion of the chip $C_M$ indicated by D in FIG. 13. FIG. 15 is an enlarged view schematically illustrating a portion of the chip $C_M$ indicated by E in FIG. 14. In FIG. 12, illustration of a partial region (first hookup region $R_{HU1}$ described later) is omitted.

For example, as illustrated in FIG. 9, the chip $C_M$ includes a transistor layer $L_{TR}$ provided on the lower surface of the semiconductor substrate 100, a wiring layer D0 provided below the transistor layer $L_{TR}$, a wiring layer D1 provided below the wiring layer D0, and a wiring layer D2 provided below the wiring layer D1. The chip $C_M$ includes a memory cell array layer $L_{MCA1}$ provided below the wiring layer D2, a memory cell array layer $L_{MCA2}$ provided below the memory cell array layer $L_{MCA1}$, and a wiring layer M0 provided below the memory cell array layer $L_{MCA2}$. As illustrated in FIG. 8, the chip $C_M$ further includes a wiring layer M1 provided below the wiring layer M0, a wiring layer M2 provided below the wiring layer M1, and a wiring layer M3 provided below the wiring layer M2.

For example, as illustrated in FIG. 11, the semiconductor substrate 100 is provided with four memory cell array regions $R_{MCA}$ arranged in the X direction and the Y direction. The memory cell array region $R_{MCA}$ includes two memory hole regions $R_{MH}$ arranged in the X direction. Further, two first hookup regions $R_{HU1}$ arranged in the X direction and a second hookup region $R_{HU2}$ provided between the two first hookup regions are provided between the two memory hole regions $R_{MH}$. A peripheral region RP is provided at the end portion of the semiconductor substrate 100 in the Y direction.

In the following description, when the "memory cell array region $R_{MCA}$", the "memory hole region $R_{MH}$", the "first hookup region $R_{HU1}$", the "second hookup region $R_{HU2}$", or the "peripheral region RP" is described, it is assumed that the described region includes not only the region in the memory cell array layers $L_{MCA1}$ and $L_{MCA2}$ but also the corresponding region in other layers (semiconductor substrate 100, transistor layer $L_{TR}$, and wiring layers D0, D1, D2, M0, M1, and M2) included in the chip $C_M$ and the corresponding region in the layers included in the chip $C_F$.

Structure of Semiconductor Substrate 100

The semiconductor substrate 100 is, for example, a semiconductor substrate configured with P-type silicon (Si) containing P-type impurities such as boron (B). For example, as illustrated in FIG. 9, an active region 100A and an insulating region 100I made of silicon oxide ($SiO_2$) or the like are provided on the front surface of the semiconductor substrate 100. The active region 100A may be an N-type well region containing N-type impurities such as phosphorus (P), a P-type well region containing P-type impurities such as boron (B), or a semiconductor substrate region in which the N-type well region and the P-type well region are not provided.

Structure of Transistor Layer $L_{TR}$

For example, as illustrated in FIG. 9, a wiring layer GC is provided on the lower surface of the semiconductor substrate 100 via an insulating layer (not illustrated). The wiring layer GC includes a plurality of electrodes gc facing the front surface of the semiconductor substrate 100. Each region of the semiconductor substrate 100 and the plurality of electrodes gc included in the wiring layer GC are connected to contacts CS, respectively.

The active regions 100A of the semiconductor substrate 100 function as channel regions of a plurality of transistors Tr constituting the peripheral circuit PC, one electrodes of a plurality of capacitors Cap, and the like, respectively.

The plurality of electrodes gc included in the wiring layer GC functions as gate electrodes of the plurality of transistors Tr constituting the peripheral circuit PC, the other electrodes of the plurality of capacitors Cap, and the like, respectively.

The contact CS extends in the Z direction and is connected to the lower surface of the semiconductor substrate 100 or the lower surface of the electrode gc at the upper end of the contact CS. An impurity region containing N-type impurities or P-type impurities is provided at a portion at which the contact CS and the semiconductor substrate 100 are connected to each other. The contact CS may include, for example, a laminated film of a barrier conductive film made of titanium nitride (TiN) or the like and a metal film made of tungsten (W) or the like.

Structure of Wiring Layers D0, D1, and D2

For example, as illustrated in FIG. 9, a plurality of wirings included in the wiring layers D0, D1, and D2 are electrically connected to at least one of the components of the memory cell array layer $L_{MCA}$, the components of the transistor layer $L_{TR}$, and the semiconductor substrate 100.

The wiring layers D0, D1, and D2 include a plurality of wirings d0, d1, and d2, respectively. The plurality of wirings d0, d1, and d2 may include, for example, a laminated film of a barrier conductive film made of titanium nitride (TiN), tantalum nitride (TaN) or the like and a metal film made of tungsten (W), copper (Cu), aluminum (Al), or the like.

Structure of Memory Cell Array Layers $L_{MCA1}$ and $L_{MCA2}$ in Memory Hole Region $R_{MH}$ For example, as illustrated in FIG. 12, a plurality of memory blocks BLK (in the example in FIG. 12, memory blocks $BLK_A$ to $BLK_H$) arranged in the Y direction are provided in the memory cell array layers $L_{MCA1}$ and $L_{MCA2}$.

In the following description, the first memory block BLK, the 4nB-th (nB is a positive integer of 1 or more) memory block BLK, the (4nB+1)th memory block BLK, and the (4nB+4)th memory block BLK counting from one side (for example, negative side in the Y direction in FIG. 12) in the Y direction may be referred to as memory blocks BLKa. In FIG. 12, memory blocks $BLK_A$, $BLK_D$, $BLK_E$, and $BLK_H$ are exemplified as the memory block BLKa. In the following description, the second memory block BLK, the third memory block BLK, the (4nB+2)th memory block BLK, and the (4nB+3)th memory block BLK counting from the one side (for example, negative side in the Y direction in FIG. 12) in the Y direction may be referred to as memory blocks BLKf. In FIG. 12, memory blocks $BLK_B$, $BLK_C$, $BLK_F$, and $BLK_G$ are exemplified as the memory block BLKf.

For example, as illustrated in FIG. 14, the memory block BLK includes a plurality of string unit SU arranged in the Y direction. An inter-block insulating layer ST made of silicon oxide ($SiO_2$) or the like is provided between two memory blocks BLK adjacent to each other in the Y direction. For example, as illustrated in FIG. 15, an inter-string unit insulating layer SHE made of silicon oxide ($SiO_2$) or the like is provided between two string units SU adjacent to each other in the Y direction.

For example, as illustrated in FIG. 9, the memory block BLK includes a plurality of conductive layers 110 arranged in the Z direction and a plurality of semiconductor pillars 120 extending in the Z direction. For example, as illustrated in FIG. 10, the memory block BLK includes a plurality of gate insulating films 130 provided between the plurality of conductive layers 110 and the plurality of semiconductor pillars 120, respectively.

The conductive layer 110 is a substantially plate-shaped conductive layer extending in the X direction. The conductive layer 110 includes a plurality of through-holes provided corresponding to the semiconductor pillars 120 (FIG. 9). The inner peripheral surfaces of the plurality of through-holes face the outer peripheral surfaces of the semiconductor pillars 120 via the gate insulating films 130, respectively. The conductive layer 110 may include a laminated film of a barrier conductive film made of titanium nitride (TiN) or the like and a metal film made of tungsten (W) or the like. The conductive layer 110 may contain, for example, polycrystalline silicon containing impurities such as phosphorus (P) or boron (B). Insulating layers 101 (FIG. 10) made of silicon oxide ($SiO_2$) or the like are provided between the plurality of conductive layers 110 arranged in the Z direction.

As illustrated in FIG. 9, a conductive layer 111 is provided above the conductive layer 110. The conductive layer 111 may contain, for example, polycrystalline silicon containing impurities such as phosphorus (P) or boron (B). An insulating layer made of silicon oxide ($SiO_2$) or the like is provided between the conductive layer 111 and the conductive layer 110.

A conductive layer 112 is provided above the conductive layer 111. The conductive layer 112 may contain, for example, polycrystalline silicon containing impurities such as phosphorus (P) or boron (B). The conductive layer 112 may contain, for example, metal such as tungsten (W) or may include a conductive layer made of tungsten silicide or the like or another conductive layer. An insulating layer made of silicon oxide ($SiO_2$) or the like is provided between the conductive layer 112 and the conductive layer 111.

The conductive layer 112 functions as the source line SL (FIG. 5). The source line SL is provided in common for all the memory blocks BLK included in the memory cell array region $R_{MCA}$ (FIG. 11), for example.

The conductive layer 111 functions as the source-side selection gate line SGSb (FIG. 5) and the gate electrodes of the plurality of source-side select transistors STSb connected to the source-side selection gate line SGSb. The conductive layer 111 is electrically independent for each memory block BLK.

Among the plurality of conductive layers 110, one or a plurality of conductive layers 110 located on the uppermost layer function as the source-side selection gate line SGS (FIG. 5) and the gate electrodes of the plurality of source-side select transistors STS connected to the source-side selection gate line SGS. The plurality of conductive layers 110 are electrically independent for each memory block BLK.

A plurality of conductive layers 110 located below the above-described conductive layers 110 function as the word lines WLs (FIG. 5) and the gate electrodes of the plurality of memory cells MC (FIG. 5) connected to the word lines WLs. The plurality of conductive layers 110 are electrically independent from each other for each memory block BLK.

One or a plurality of conductive layers 110 located below the above-described conductive layers 110 function as the drain-side selection gate line SGD and the gate electrodes of the plurality of drain-side select transistors STD (FIG. 5) connected to the drain-side selection gate line SGD. The widths of the plurality of conductive layers 110 that function as the drain-side selection gate line SGD in the Y direction are smaller than the widths of the other conductive layers 110 that function as the word lines WLs. The inter-string unit insulating layer SHE (FIG. 15) is provided between the two conductive layers 110 that function as the drain-side selection gate line SGD and are adjacent to each other in the Y direction. The plurality of conductive layers 110 functioning as the drain-side selection gate line SGD are electrically independent for each string unit SU.

For example, as illustrated in FIG. 15, the semiconductor pillars 120 are arranged in the X direction and the Y direction in a predetermined pattern. The semiconductor pillars 120 function as channel regions of the plurality of memory cells MC and select transistors (STD and STS) included in one memory string MS (FIG. 5). The semiconductor pillar 120 is a semiconductor layer made of polycrystalline silicon (Si), for example. For example, the semiconductor pillar 120 has, for example, a substantially cylindrical shape, and an insulating layer 125 (FIG. 10) made of silicon oxide or the like is provided at a central portion of the semiconductor pillar 120. An outer peripheral surface of each of the semiconductor pillars 120 is surrounded by the conductive layer 110 and faces the conductive layer 110.

As illustrated in FIG. 9, the semiconductor pillar 120 includes a semiconductor portion $120_U$ provided in the memory cell array layer $L_{MCA1}$ and a semiconductor portion $120_L$ provided in the memory cell array layer $L_{MCA2}$.

The semiconductor portion $120_U$ faces a plurality of conductive layers 110 provided in the memory cell array layer $L_{MCA1}$. An impurity region containing N-type impurities such as phosphorus (P) is provided at an upper end portion of the semiconductor portion $120_U$. Such an impurity region is connected to the conductive layer 112 (FIG. 9).

The semiconductor portion $120_L$ faces the plurality of conductive layers 110 provided in the memory cell array layer $L_{MCA2}$. An impurity region containing N-type impurities such as phosphorus (P) is provided at a lower end portion of the semiconductor portion $120_L$. Such an impurity region is connected to the bit line BL via a contact Ch and a contact Vy.

The gate insulating film 130 (FIG. 10) has a substantially cylindrical shape that covers the outer peripheral surface of the semiconductor pillar 120. For example, as illustrated in FIG. 10, the gate insulating film 130 includes a tunnel insulating film 131, a charge storage film 132, and a block insulating film 133, which are stacked between the semiconductor pillar 120 and the conductive layer 110. The tunnel insulating film 131 and the block insulating film 133 are insulating films made of silicon oxide ($SiO_2$), for example. The charge storage film 132 is a film that is made of silicon nitride ($Si_3N_4$) and is capable of storing charges, for example. The tunnel insulating film 131, the charge storage film 132, and the block insulating film 133 have a substantially cylindrical shape, and extend in the Z direction along the outer peripheral surface of the semiconductor pillar 120.

FIG. 10 illustrates an example in which the gate insulating film 130 includes the charge storage film 132 made of silicon nitride or the like. However, the gate insulating film 130 may include, for example, a floating gate made of polycrystalline silicon containing N-type or P-type impurities.

Structure of Memory Cell Array Layer $L_{MCA2}$ in First Hookup Region $R_{HU1}$ As illustrated in FIG. 13, contact connection small-regions $r_{CC1}$ provided respectively corresponding to the memory blocks BLK are provided in the first hookup region $R_{HU1}$. A contact connection small-region $r_{C4T}$ provided corresponding to the memory block BLKf is provided in the first hookup region $R_{HU1}$.

As illustrated in FIG. 14, end portions of the plurality of conductive layers 110 functioning as the drain-side selection gate line SGD, in the X direction, are provided in the contact connection small-region $r_{CC1}$. A plurality of contacts CC arranged in a matrix when viewed from the Z direction are provided in the contact connection small-region $r_{CC1}$. The plurality of contacts CC extend in the Z direction and are connected to the conductive layers 110 at the upper ends of the contacts CC. The contact CC may include, for example, a laminated film of a barrier conductive film made of titanium nitride (TiN) or the like and a metal film made of tungsten (W) or the like.

Among the plurality of contacts CC arranged in the X direction, the contact CC closest to the memory hole region $R_{MH}$ is connected to the first conductive layer 110 counting from the bottom. The second contact CC closest to the memory hole region $R_{MH}$ is connected to the second conductive layer 110 counting from the bottom. In the followings, similarly, the a-th (a is a positive integer of 1 or more) contact CC closest to the memory hole region $R_{MH}$ is connected to the a-th conductive layer 110 counting from the bottom. Some of the plurality of contacts CC are connected to the drain electrodes of the transistors Tr in the chip $C_M$ or the chip $C_P$ via the wiring m0 and the like in the wiring layer M0.

Among the plurality of contacts CC, the contacts corresponding to the memory blocks BLKf (FIG. 13) are connected to contacts C4 in the contact connection small-region $r_{C4T}$ corresponding to the memory blocks BLKf, respectively, and are electrically connected to the transistors Tr provided on the semiconductor substrate 100 in the chip $C_M$ via the contacts C4. Among the plurality of contacts CC, the contacts corresponding to the memory blocks BLKa (FIG. 13) are connected to contacts C4 in the contact connection small-region $r_{C4T}$ corresponding to the memory blocks BLKf adjacent to the memory blocks BLKa, respectively, and are electrically connected to the transistors Tr provided on the semiconductor substrate 100 in the chip $C_M$ via the contacts C4.

For example, as illustrated in FIG. 14, a support structure HR provided near the contact CC is provided in the first hookup region $R_{HU1}$. The support structure HR extends in the Z direction and is connected to the conductive layer 112 at the upper end of the support structure HR. The support structure HR includes an insulating layer made of silicon oxide (SiO$_2$), for example.

Two insulating layers $S_{TO}$ arranged in the Y direction are provided in the contact connection small-region $r_{C4T}$. The two insulating layers $S_{TO}$ are provided between two interblock insulating layers ST arranged in the Y direction. For example, as illustrated in FIG. 9, the plurality of insulating layers 110A arranged in the Z direction and the plurality of contacts C4 extending in the Z direction are provided between the two insulating layers $S_{TO}$.

The insulating layer $S_{TO}$ (FIG. 14) extends in the X direction and the Z direction and is connected to the conductive layer 112 at the upper end of the insulating layer $S_{TO}$. The insulating layer $S_{TO}$ contains, for example, silicon oxide (SiO$_2$).

The insulating layer 110A is a substantially plate-shaped insulating layer extending in the X direction. The insulating layer 110A may include an insulating layer made of silicon nitride (Si$_3$N$_4$) or the like. Insulating layers made of silicon oxide (SiO$_2$) or the like are provided between the plurality of insulating layers 110A arranged in the Z direction.

The plurality of contacts C4 are arranged in the X direction. The contact C4 may include a laminated film of a barrier conductive film made of titanium nitride (TiN) or the like and a metal film made of tungsten (W) or the like. For example, as illustrated in FIG. 9, the outer peripheral surface of the contact C4 is surrounded by the respective insulating layers 110A, and is connected to the insulating layers 110A. For example, as illustrated in FIG. 9, the contact C4 extends in the Z direction, is connected to the wiring m0 in the wiring layer M0 at the lower end of the contact C4, and is connected to the wiring d2 in the wiring layer D2 at the upper end of the contact C4.

The plurality of conductive layers 110 functioning as the drain-side selection gate line SGD may be connected to the transistors Tr in the chip $C_P$ instead of the transistors Tr in the chip $C_M$. In this case, the plurality of conductive layers 110 are electrically connected to the transistors Tr provided on the semiconductor substrate 150 of the chip $C_P$ via the contacts CC, the first bonding electrode $P_{f1}$, and the second bonding electrode $P_{f2}$. Further, in this case, the contact connection small-region $r_{C4T}$ in the first hookup region $R_{HU1}$ may also be omitted.

Structure of Memory Cell Array Layers $L_{MCA1}$ and $L_{MCA2}$ in Second Hookup region $R_{HU2}$ As illustrated in FIG. 12, a plurality of contact connection small-regions $r_{CC2}$ and a plurality of contact connection small-regions $r_{C4T}$ are provided in a region of the second hookup region $R_{HU2}$ on one side (for example, negative side in the X direction in FIG. 12) in the X direction. The plurality of contact connection small-regions $r_{CC2}$ are provided at positions corresponding to the memory blocks BLKa. The plurality of contact connection small-regions $r_{C4T}$ are provided at positions corresponding to the memory blocks BLKf.

As illustrated in FIG. 12, a plurality of contact connection small-regions $r_{CC2}$ and a plurality of contact connection small-regions $r_{C4T}$ are also provided in a region of the second hookup region $R_{HU2}$ on the other side (for example, positive side in the X direction in FIG. 12) in the X direction. The plurality of contact connection small-regions $r_{CC2}$ are provided at positions corresponding to the memory blocks BLKf. The plurality of contact connection small-regions $r_{C4T}$ are provided at positions corresponding to the memory blocks BLKa.

Some of the plurality of conductive layers 110 functioning as the word line WL or the source-side selection gate line SGS are provided in the contact connection small-region $r_{CC2}$. A plurality of contacts CC arranged in the X direction are provided in the contact connection small-region $r_{CC2}$. For example, as illustrated in FIG. 9, the plurality of contacts CC extend in the Z direction and are connected to the conductive layers 110 at the upper ends of the contacts CC. The contact CC may include, for example, a laminated film of a barrier conductive film made of titanium nitride (TiN) or the like and a metal film made of tungsten (W) or the like.

Among the plurality of contacts CC arranged in the X direction, the contact CC closest to the memory hole region $R_{MH}$ is connected to the first conductive layer 110 counting from the top. The second contact CC closest to the memory hole region $R_{MH}$ is connected to the second conductive layer 110 counting from the top. In the followings, similarly, the b-th (b is a positive integer of 1 or more) contact CC closest to the memory hole region $R_{MH}$ is connected to the b-th conductive layer 110 counting from the top.

For example, as illustrated in FIGS. 8 and 12, some of the plurality of contacts CC are connected to the contacts C4 in the contact connection small-region $r_{C4T}$ corresponding to the memory blocks BLK adjacent to the memory block BLK, via the wiring m0 extending in the Y direction, respectively, and are electrically connected to the transistors Tr provided on the semiconductor substrate 100 in the chip $C_M$ via the contacts C4. Some of the plurality of contacts CC are electrically connected to the transistors Tr provided on the semiconductor substrate 150 of the chip $C_P$ via the first bonding electrode $P_{f1}$ and the second bonding electrode $P_{f2}$, respectively.

Structure of Wiring Layers M0, M1, M2, and M3

As illustrated in FIG. 8, the plurality of wirings included in the wiring layers M0, M1, M2, and M3 are electrically connected to at least one of the components in the memory cell array layers $L_{MCA1}$ and $L_{MCA2}$, the components in the transistor layer $L_{TR}$, and the components in the chip $C_P$.

The wiring layers M0, M1, and M2 include a plurality of wirings m0, m1, and m2, respectively. The plurality of wirings m0, m1, and m2 may include, for example, a laminated film of a barrier conductive film made of titanium nitride (TiN), tantalum nitride (TaN) or the like and a metal film made of tungsten (W), copper (Cu), or the like. Some of the plurality of wirings m0 function as the bit lines BL (FIG. 5). For example, as illustrated in FIG. 15, the bit lines BL are arranged in the X direction and extend in the Y direction. Each of the plurality of bit lines BL is connected to one semiconductor pillar 120 included in each string unit SU.

For example, as illustrated in FIG. 8, the wiring layer M3 includes a plurality of first bonding electrodes $P_{I1}$. The plurality of first bonding electrodes $P_{I1}$ may include, for example, a laminated film of a barrier conductive film made of titanium nitride (TiN), tantalum nitride (TaN) or the like and a metal film made of copper (Cu), or the like.

Structure of Chip $C_P$

Figure 16:
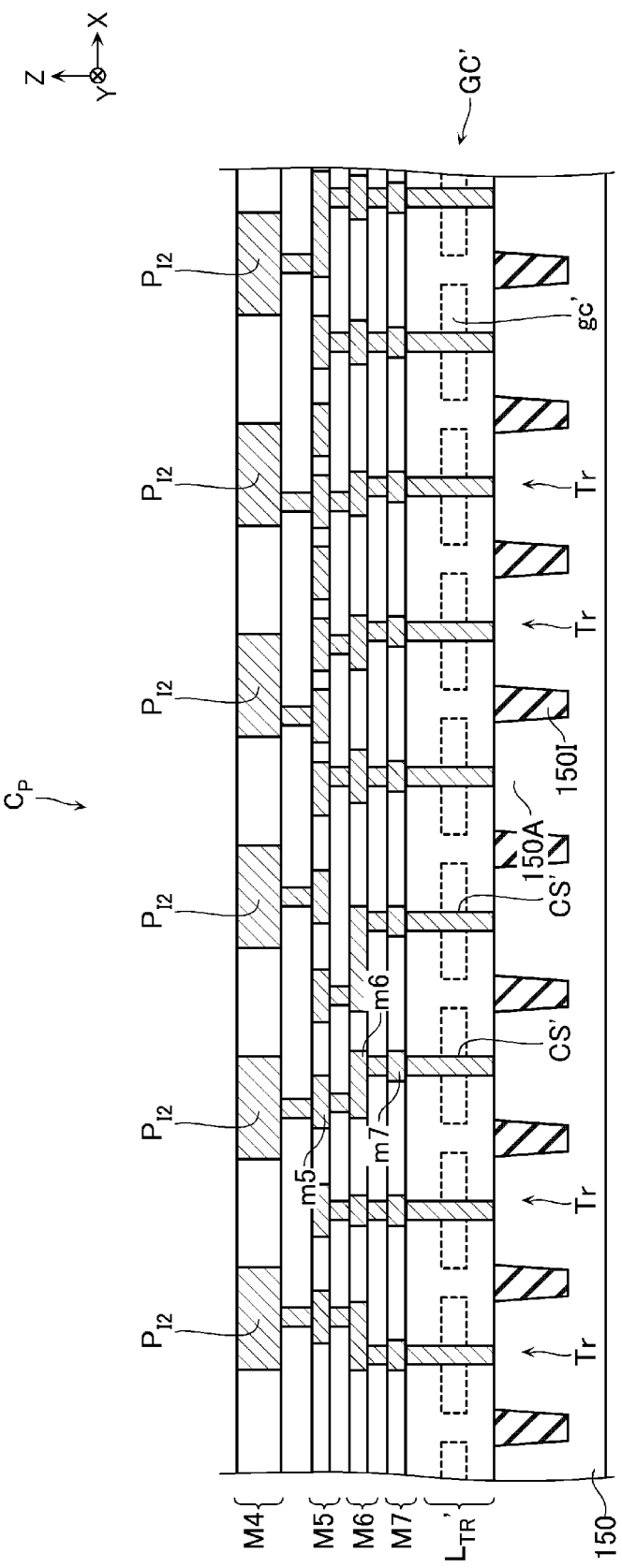
FIG. 16 is a cross-sectional view schematically illustrating a second chip of the memory die.

FIG. 16 is a cross-sectional view schematically illustrating the chip $C_P$. The chip $C_P$ includes, for example, a transistor layer $L_{TR}'$ provided on the upper surface of the semiconductor substrate 150, a wiring layer M7 provided above the transistor layer $L_{TR}'$, a wiring layer M6 provided above the wiring layer M7, a wiring layer M5 provided above the wiring layer M6, and a wiring layer M4 provided above the wiring layer M5.

The semiconductor substrate 150 is a semiconductor substrate configured with P-type silicon (Si) containing P-type impurities such as boron (B), for example. An active region 150A and an insulating region 150I made of silicon oxide ($SiO_2$) or the like are provided on the front surface of the semiconductor substrate 150. The active region 150A may be an N-type well region containing N-type impurities such as phosphorus (P), a P-type well region containing P-type impurities such as boron (B), or a semiconductor substrate region in which the N-type well region and the P-type well region are not provided.

Structure of Transistor Layer $L_{TR}'$

For example, as illustrated in FIG. 16, a wiring layer GC' is provided on the upper surface of the semiconductor substrate 150 via an insulating layer (not illustrated). The wiring layer GC' includes a plurality of electrodes gc' facing the front surface of the semiconductor substrate 150. The plurality of electrodes gc' included in each region of the semiconductor substrate 150 and the wiring layer GC' are connected to contacts CS', respectively.

The active regions 150A of the semiconductor substrate 150 function as channel regions of a plurality of transistors Tr constituting the peripheral circuit PC, one electrodes of a plurality of capacitors, and the like, respectively.

The plurality of electrodes gc' included in the wiring layer GC' functions as gate electrodes of the plurality of transistors Tr constituting the peripheral circuit PC, the other electrodes of the plurality of capacitors, and the like, respectively.

The contact CS' extends in the Z direction and is connected to the upper surface of the semiconductor substrate 150 or the upper surface of the electrode gc' at the lower end of the contact CS'. An impurity region containing N-type impurities or P-type impurities is provided at a portion at which the contact CS' and the semiconductor substrate 150 are connected to each other. The contact CS' may include, for example, a laminated film of a barrier conductive film made of titanium nitride (TiN) or the like and a metal film made of tungsten (W) or the like.

Structure of Wiring Layers M7, M6, and M5

A plurality of wirings included in the wiring layers M7, M6, and M5 are electrically connected to at least one of the components in the transistor layer $L_{TR}'$ and the semiconductor substrate 150.

The wiring layers M7, M6, and M5 include a plurality of wirings m7, m6, and m5, respectively. The plurality of wirings m7, m6, and m5 may include, for example, a laminated film of a barrier conductive film made of titanium nitride (TiN), tantalum nitride (TaN) or the like and a metal film made of tungsten (W), copper (Cu), aluminum (Al), or the like.

The wiring layer M4 includes a plurality of second bonding electrodes $P_{I2}$. The plurality of second bonding electrodes $P_{I2}$ may include, for example, a laminated film of a barrier conductive film made of titanium nitride (TiN), tantalum nitride (TaN) or the like and a metal film made of copper (Cu), or the like.

Arrangement of Transistors Tr Constituting Peripheral Circuit PC

Figure 17:
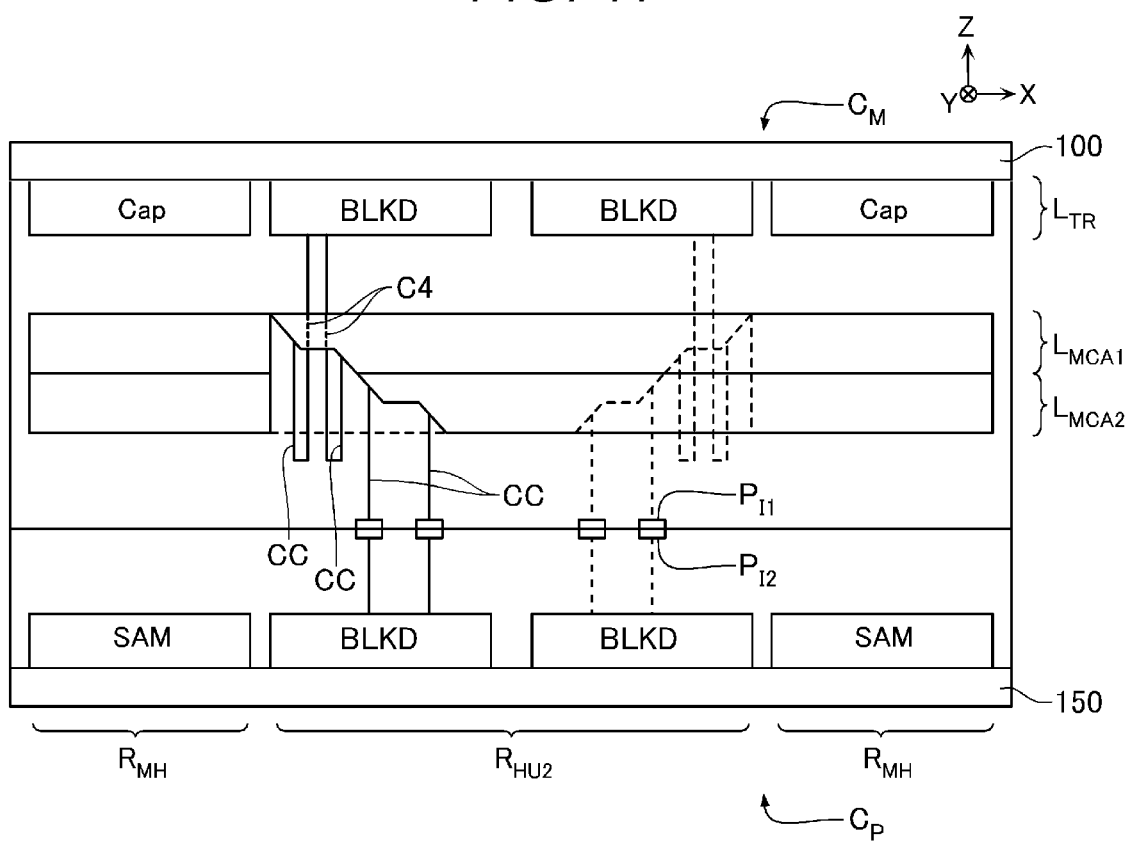
FIG. 17 is a cross-sectional view schematically illustrating the configuration of the memory die including the first and second chips.
Figure 18:
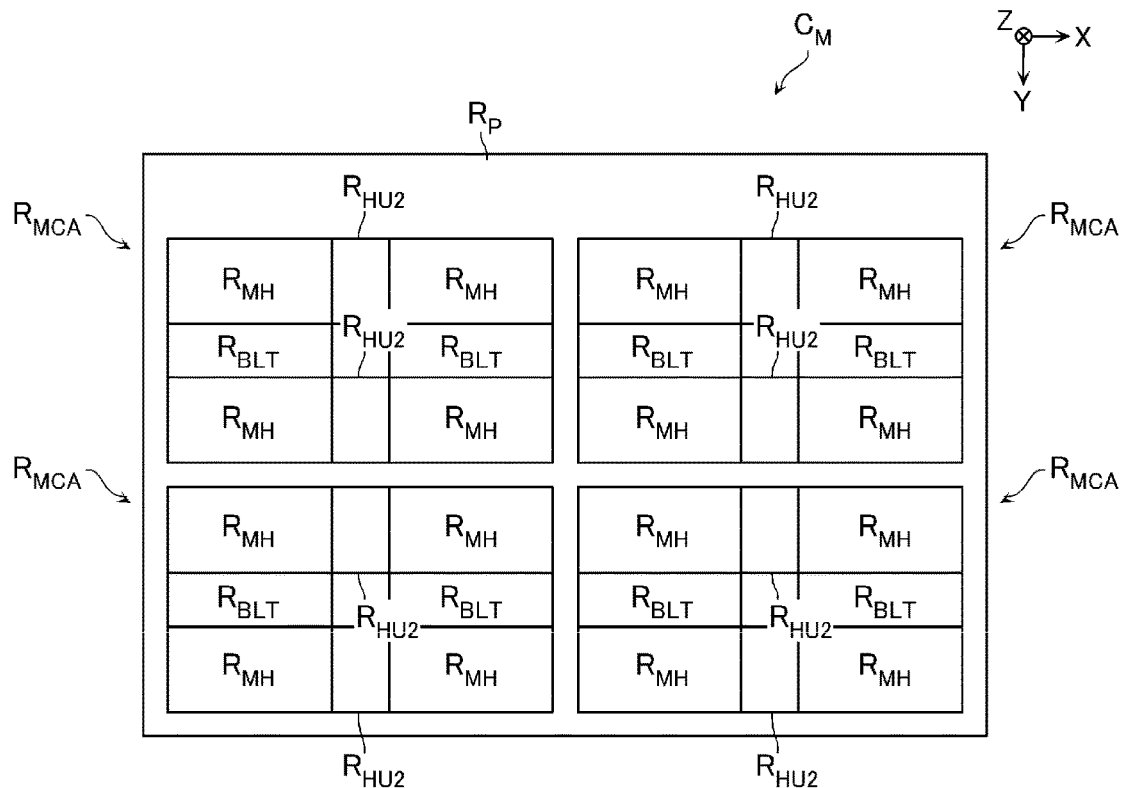
FIG. 18 is a bottom view schematically illustrating a configuration of memory cell array layers in the first chip.
Figure 19:
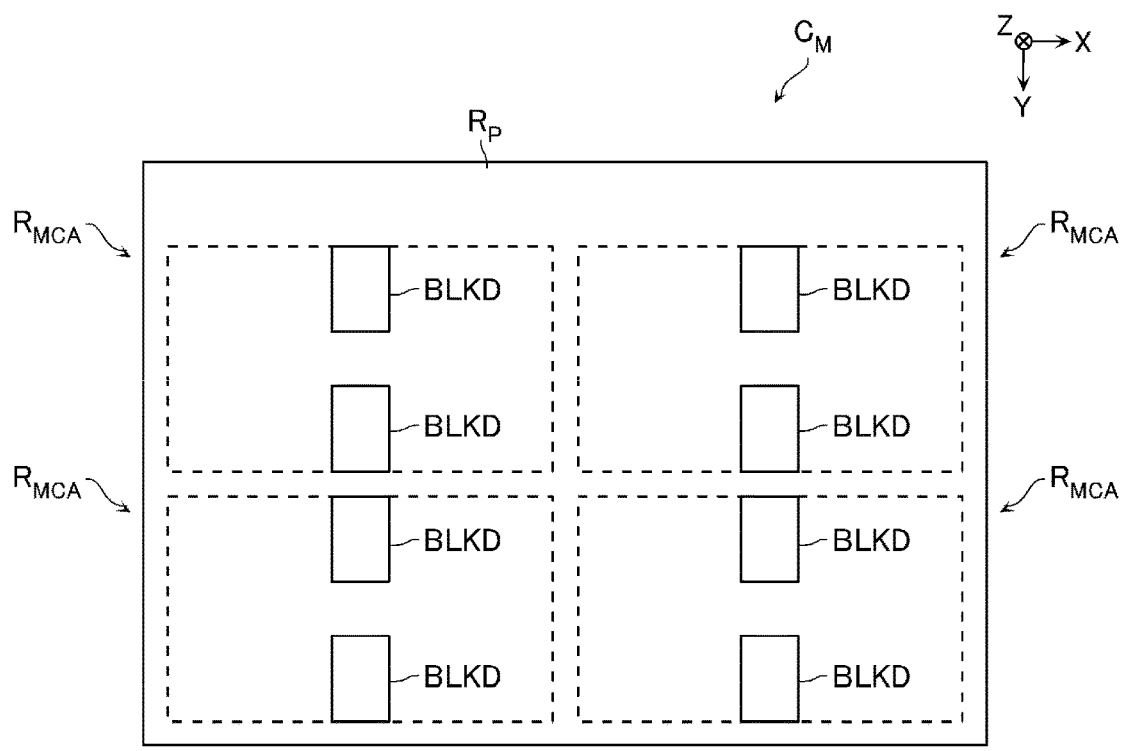
FIG. 19 is a bottom view schematically illustrating a configuration of a transistor layer in the first chip.
Figure 20:
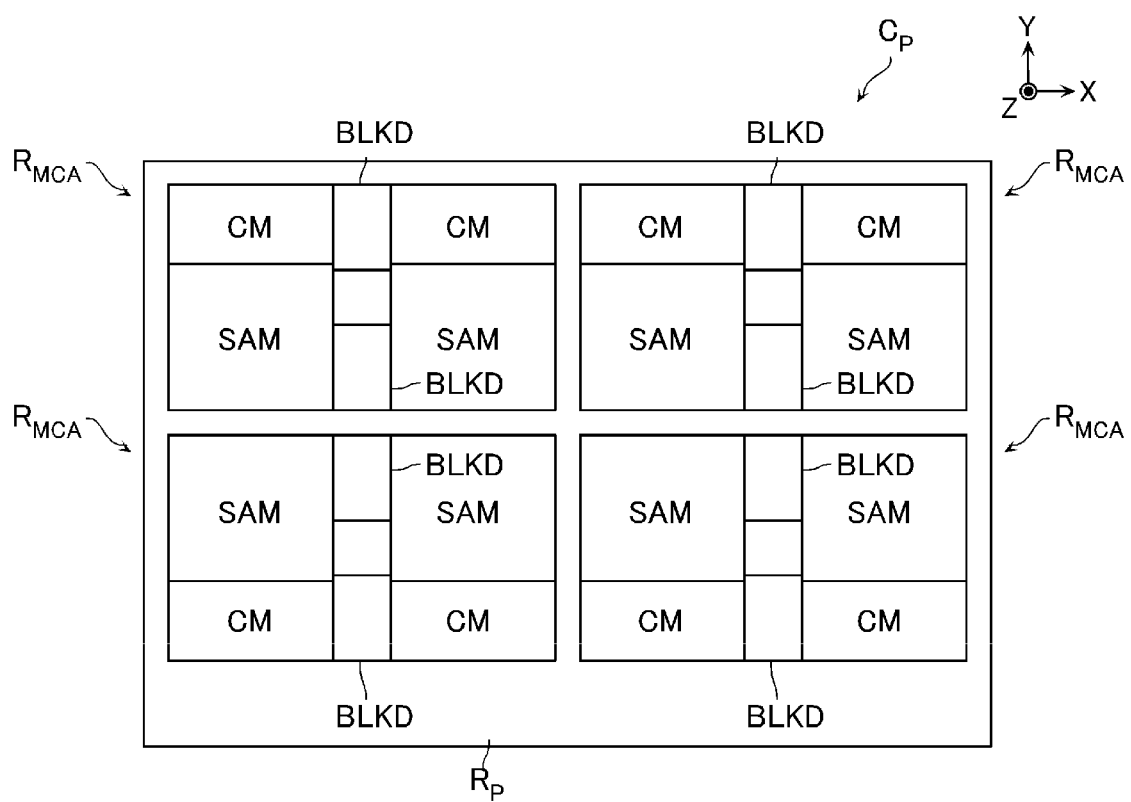
FIG. 20 is a plan view schematically illustrating a configuration of the second chip.
Figure 21:
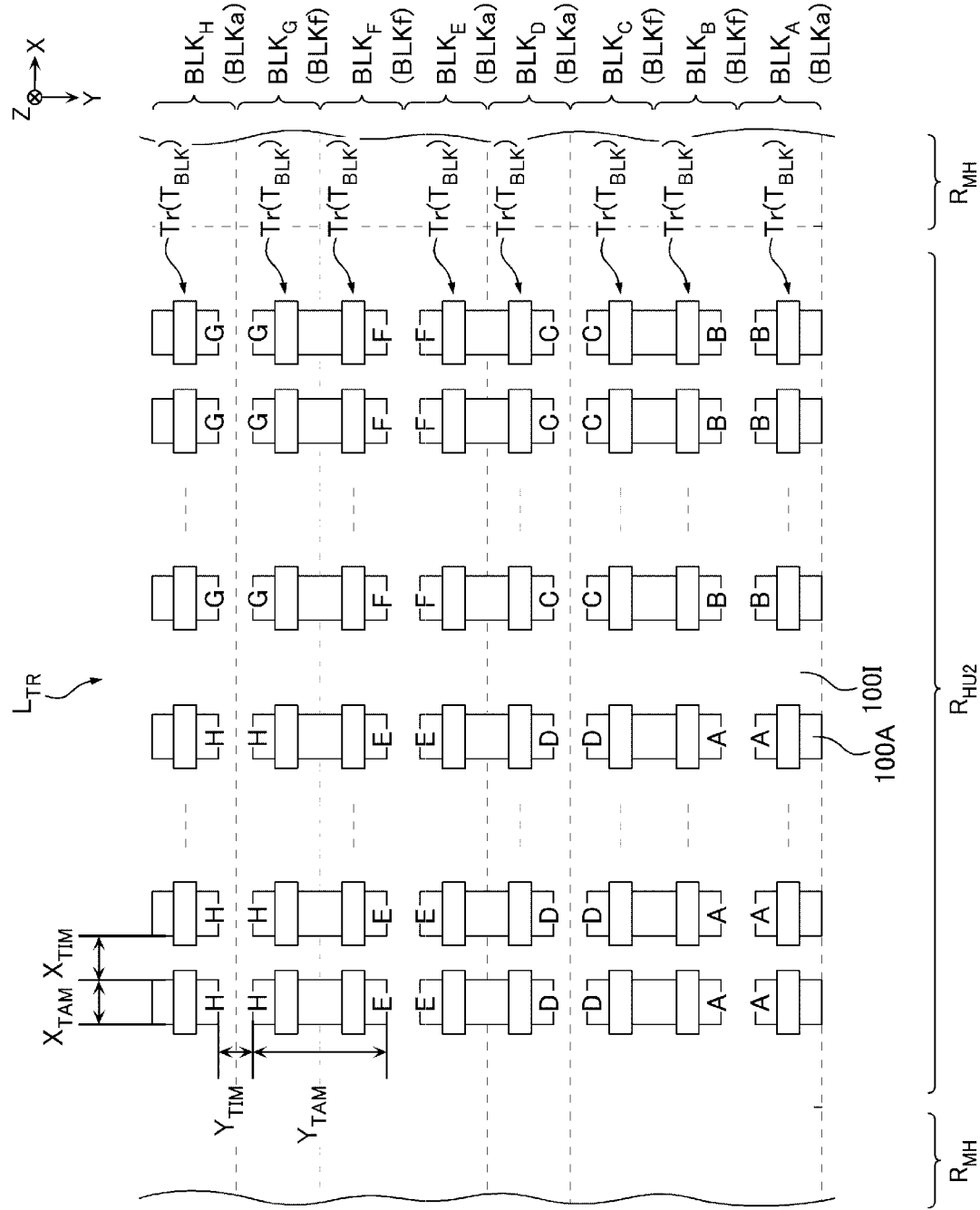
FIG. 21 is a bottom view schematically illustrating the transistor layer in the first chip.
Figure 22:
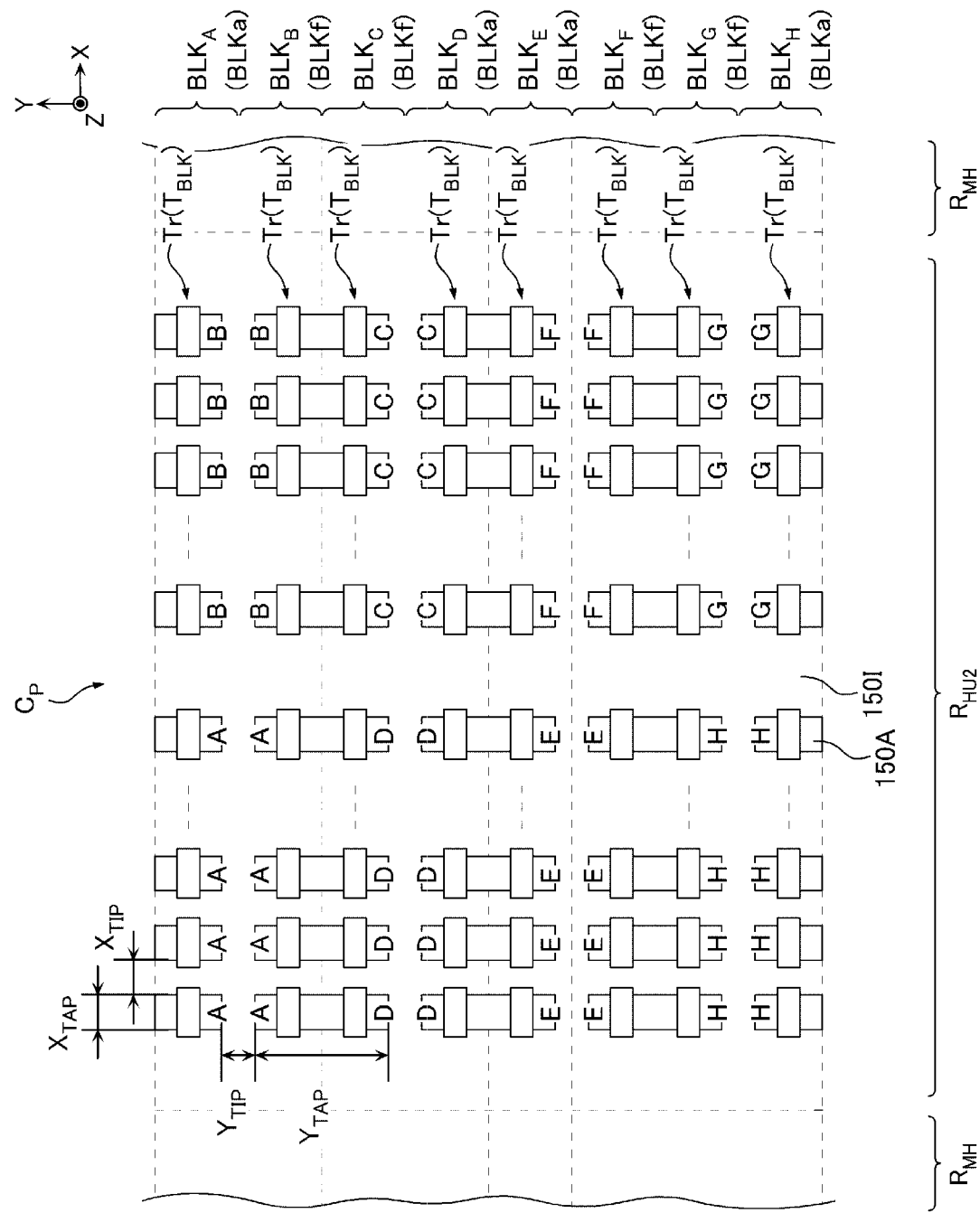
FIG. 22 is a plan view schematically illustrating a partial configuration of the second chip.

Next, the arrangement of the transistors Tr constituting the peripheral circuit PC will be described with reference to FIGS. 17 to 22. FIG. 17 is a cross-sectional view schematically illustrating the configuration of the memory die MD. FIG. 18 is a bottom view schematically illustrating the configuration of the memory cell array layers $L_{MCA1}$ and $L_{MCA2}$ in the chip $C_M$. FIG. 19 is a bottom view schematically illustrating the configuration of the transistor layer $L_{TR}$ in the chip $C_M$. FIG. 20 is a plan view schematically illustrating the configuration of the chip $C_P$. FIG. 21 is a bottom view schematically illustrating the transistor layer $L_{TR}$ in the chip $C_M$. FIG. 22 is a plan view schematically illustrating a partial configuration of the chip $C_P$. FIGS. 21 and 22 illustrate the components provided at positions overlapping the components in FIG. 12 when viewed from the Z direction.

FIG. 18 illustrates a region $R_{BLT}$ in the memory cell array region $R_{MCA}$, which is not described with reference to FIG. 11. For example, components for connecting the bit lines BL (FIG. 9) and the transistors Tr in the chip $C_P$ to each other are provided in the region $R_{BLT}$. In FIGS. 17 to 22, the illustration of the first hookup region $R_{HU1}$ is omitted similar to FIG. 12.

Arrangement of Transistors Tr in Chip $C_M$

As described above, the plurality of transistors Tr are provided in the transistor layer $L_{TR}$ of the chip $C_M$. As illustrated in FIGS. 18 and 19, among the plurality of transistors Tr, the transistor Tr provided in the second hookup region $R_{Hu2}$ functions as a portion (transistor $T_{BLK}$) of the block decoder BLKD described with reference to FIG. 6. For example, the capacitors Cap (FIG. 17) may be provided in other regions instead of the transistors Tr. For example, as illustrated in FIG. 9, the capacitor Cap may include an active region 100A, an electrode gc, and a gate insulating film provided between the active region 100A and the electrode gc, similar to the transistor Tr. The film thickness (thickness in the Z direction) of the electrode gc and the gate insulating film constituting the capacitor Cap may be substantially equal to the film thickness (thickness in the Z direction) of the electrode gc and the gate insulating film constituting the transistor Tr. The capacitor Cap maybe connected between the bonding pad electrode $P_X$ to which the power-source voltage $V_{CC}$ or $V_{CCQ}$ is supplied, and the bonding pad electrode $P_X$ to which the ground voltage $V_{SS}$ is supplied.

In the example of FIG. 21, a plurality of transistor rows arranged in the Y direction are provided in the second hookup region $R_{HU2}$ to correspond to the plurality of memory blocks BLK arranged in the Y direction. Each transistor row includes a plurality of transistors Tr arranged in the X direction.

In the example of FIG. 21, a plurality of transistors Tr are provided at positions corresponding to the contact connection small-regions $r_{CC2}$ (see FIG. 12) including the contacts CC connected to the memory blocks $BLK_A$. A plurality of transistors Tr are provided at positions which correspond to $BLK_B$ and correspond to the contact connection small-regions $r_{C4T}$ (see FIG. 12) including the contacts C4 connected to the memory block $BLK_A$. Each of the drain electrodes of the plurality of transistors Tr is electrically connected to the word line WL or the like in the memory block $BLK_A$ via the contact C4. Each of the drain electrodes of the plurality of transistors Tr are electrically connected to any of the wirings m7, m6, and m5 functioning as the wiring CG (FIG. 6) via the contacts C4 in the second hookup region $R_{HU2}$, the wirings m0, m1, and m2, the first bonding electrode $P_{I1}$, and the second bonding electrode $P_{I2}$.

Similarly, in the example of FIG. 21, a plurality of transistors Tr are provided at positions corresponding to the contact connection small-regions $r_{CC2}$ including the contacts CC connected to any memory block BLK. A plurality of transistors Tr are provided at positions which correspond to a memory block BLK adjacent to the above memory block BLK and correspond to the contact connection small-regions $r_{C4T}$ including the contacts C4 connected to the above memory block BLK. Each of the drain electrodes of the plurality of transistors Tr is electrically connected to the word line WL or the like in the corresponding memory block BLK via the contact C4. Each of the drain electrodes of the plurality of transistors Tr are electrically connected to any of the wirings m7, m6, and m5 functioning as the wiring CG (FIG. 6) via the contacts C4 in the second hookup region $R_{HU2}$, the wirings m0, m1, and m2, the first bonding electrode $P_{I1}$, and the second bonding electrode $P_{I2}$.

In the example of FIG. 21, the width of the active region 100A corresponding to the transistor $T_{BLK}$ is set as a width $X_{TAM}$, and the length of the active region 100A corresponding to the transistor $T_{BLK}$ in the Y direction is set as $Y_{TAM}$. In the example of FIG. 21, the distance between two adjacent active regions 100A in the X direction is set as a distance $X_{TIM}$, and the distance between the two adjacent active regions 100A in the Y direction is set as a distance $Y_{TIM}$.

Arrangement of Transistors Tr in Chip $C_P$

As described above, the plurality of transistors Tr are provided on the front surface of the semiconductor substrate 150 of the chip $C_P$. As illustrated in FIGS. 18 and 20, among the plurality of transistors Tr, the transistor Tr provided in the second hookup region $R_{HU2}$ functions as a portion (transistor $T_{BLK}$) of the block decoder BLKD described with reference to FIG. 6. The transistor provided in the memory hole region $R_{MH}$ functions as a portion of the sense amplifier module SAM or the cache memory CM (FIG. 4).

In the example of FIG. 22, a plurality of transistor rows arranged in the Y direction are provided in the second hookup region $R_{HU2}$ to correspond to the plurality of memory blocks BLK arranged in the Y direction. Each transistor row includes a plurality of transistors Tr arranged in the X direction.

In the example of FIG. 22, a plurality of transistors Tr are provided at positions corresponding to the contact connection small-regions $r_{CC2}$ (see FIG. 12) including the contacts CC connected to the memory blocks $BLK_A$. A plurality of transistors Tr are provided at positions which correspond to $BLK_B$ and correspond to the contact connection small-regions $r_{C4T}$ (see FIG. 12) including the contacts C4 connected to the memory block $BLK_A$. Each of the plurality of transistors Tr is electrically connected to the word line WL or the like in the memory block $BLK_A$ via the first bonding electrode $P_{I1}$ and the second bonding electrode $P_{I2}$.

Similarly, in the example of FIG. 22, a plurality of transistors Tr are provided at positions corresponding to the contact connection small-regions $r_{CC2}$ including the contacts CC connected to any memory block BLK. A plurality of transistors Tr are provided at positions which correspond to a memory block BLK adjacent to the above memory block BLK and correspond to the contact connection small-regions $r_{C4T}$ including the contacts C4 connected to the above memory block BLK. Each of the plurality of transistors Tr is electrically connected to the word line WL or the like in the corresponding memory block BLK via the first bonding electrode $P_{I1}$ and the second bonding electrode $P_{I2}$.

In the example of FIG. 22, the width of the active region 150A corresponding to the transistor $T_{BLK}$, in the X direction, is set as $X_{TAP}$, and the length of the active region 150A corresponding to the transistor $T_{BLK}$, in the Y direction, is set as $Y_{TAP}$. In the example of FIG. 22, the distance between two adjacent active regions 100A in the X direction is set as a distance $X_{TIP}$, and the distance between the two adjacent active regions 100A in the Y direction is set as a distance $Y_{TIP}$.

In the examples of FIGS. 21 and 22, the width $X_{TAP}$ is smaller than the width $X_{TAM}$. The distance $X_{TIP}$ is smaller than the distance $X_{TIM}$. The length $Y_{TAP}$ is equal to the length $Y_{TAM}$. The distance $Y_{TIP}$ is equal to the distance $Y_{TIM}$. For example, the width of the entire region in which the transistors $T_{BLK}$ are provided on the front surface of the semiconductor substrate 100, in the X direction, maybe larger than the width of the entire region in which the transistors $T_{BLK}$ are provided on the front surface of the semiconductor substrate 150, in the X direction. In such a case, for example, all the transistors $T_{BLK}$ included in the chip $C_P$ may be provided within the range of the second hookup region $R_{HU2}$, and the transistors $T_{BLK}$ included in the chip $C_P$ may be provided over the second hookup region $R_{HU2}$, and the first hookup region $R_{HU1}$, and a portion of the memory hole region $R_{MH}$.

Effect of First Embodiment

As described above, the plurality of conductive layers 110 are electrically connected to the plurality of transistors $T_{BLK}$. The transistor $T_{BLK}$ is provided corresponding to the conductive layer 110. That is, the number of transistors $T_{BLK}$ is equal to the number of conductive layers 110. Here, when the semiconductor storage device is highly integrated in the Z direction, the number of conductive layers 110 stacked in the Z direction increases. In this case, the number of transistors $T_{BLK}$ also increases corresponding to the number of conductive layers 110. Here, considering the wiring layout connected to the circuit of the transistor $T_{BLK}$, it is preferable that the circuit of the transistor $T_{BLK}$ extends from the second hookup region $R_{HU2}$ in the X direction and is arranged, which contributes to the reduction of the wiring area. However, in a case where the circuit area of the transistor $T_{BLK}$ becomes large in the X direction, there is a concern that high density integration of the semiconductor storage device in the X direction has a difficulty, and high density integration is hindered.

Thus, in the first embodiment, both the transistor Tr in the chip $C_P$ and the transistor Tr in the chip $C_M$ are used as the transistor $T_{BLK}$. According to such a configuration, it is possible to implement a semiconductor storage device that facilitates high density integration in the X direction by appropriately dividing and arranging the circuit of the transistor $T_{BLK}$ in the Z direction.

For the reason in the manufacturing process, the transistor Tr in the chip $C_M$ may have an operating speed slower than the transistor Tr in the chip $C_P$. Here, the transistor $T_{BLK}$ has a need for a high-speed operation, which is lower than the input/output control circuit I/O (FIG. 4), for example. Thus, when the transistor Tr is used as the transistor $T_{BLK}$, it is considered that, even though the transistor Tr in the chip $C_M$ and the transistor Tr in the chip $C_P$ are used together, the influence on the operating speed of the semiconductor storage device is small. Thus, in the first embodiment, it is possible to achieve high density integration of a semiconductor storage device while suppressing the influence on the operating speed.

For the reason in the manufacturing process, the transistor Tr in the chip $C_M$ may have a more difficulty in high density integration than the transistor Tr in the chip $C_P$. Therefore, in the first embodiment, the width $X_{TAM}$ (FIG. 21) of the active region 100A constituting the transistor $T_{BLK}$ in the chip $C_M$, in the X direction, is set to be larger than the width $X_{TAP}$ (FIG. 22) of the active region 150A constituting the transistor $T_{BLK}$ in the chip $C_P$, in the X direction. As a result, in the first embodiment, it is possible to achieve high density integration of a semiconductor storage device while suppressing a decrease in yield.

Second Embodiment

Figure 23:
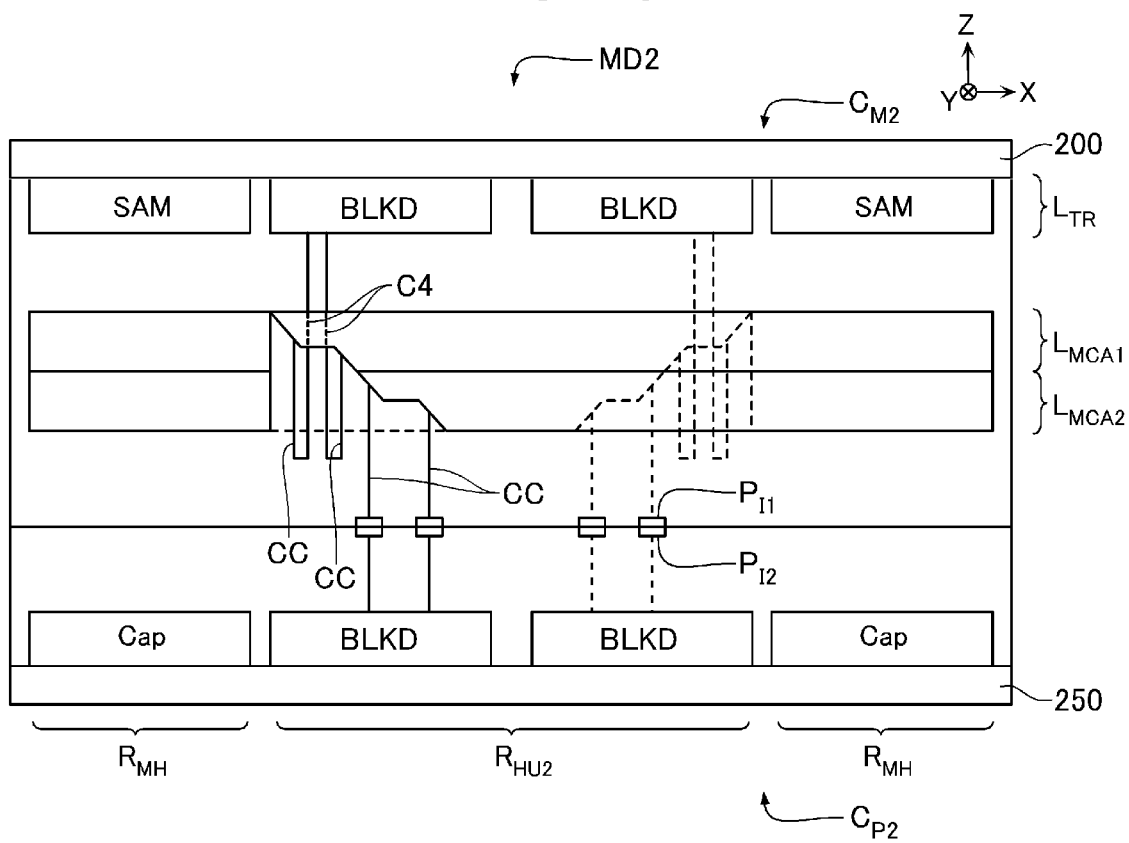
FIG. 23 is a cross-sectional view schematically illustrating a semiconductor storage device according to a second embodiment.

Next, a semiconductor storage device according to a second embodiment will be described with reference to FIG. 23. FIG. 23 is a cross-sectional view schematically illustrating a semiconductor storage device according to the second embodiment.

For example, as illustrated in FIG. 17 and the like, the memory die MD according to the first embodiment includes the chip $C_M$ including the memory cell array MCA and the chip $C_P$ bonded to the chip $C_M$. The peripheral circuit PC is mainly configured with the transistors Tr included in the chip $C_P$, and the transistors Tr included in the memory cell array MCA are used only as some of the plurality of transistors $T_{BLK}$. On the other hand, for example, as illustrated in FIG. 23, a memory die MD2 according to the second embodiment includes a chip $C_{M2}$ including a memory cell array MCA and a chip $C_{P2}$ bonded to the chip $C_{M2}$.

The chip $C_{M2}$ is basically configured in a manner similar to the chip $C_M$. However, the chip $C_{M2}$ includes a semiconductor substrate 200 instead of the semiconductor substrate 100. The semiconductor substrate 200 is basically configured in a manner similar to the semiconductor substrate 100. However, among a plurality of transistors Tr provided on the front surface of the semiconductor substrate 200, the transistors provided in a memory hole region $R_{MH}$ function as a portion of the sense amplifier module SAM or the cache memory CM (FIG. 4).

The chip $C_{P2}$ is basically configured in a manner similar to the chip C. However, the chip $C_{P2}$ includes a semiconductor substrate 250 instead of the semiconductor substrate 150. The semiconductor substrate 250 is basically configured in a manner similar to the semiconductor substrate 150. However, the above-described capacitor Cap is provided in a region other than the second hookup region $R_{HU2}$ on the surface of the semiconductor substrate 250 of the chip $C_{P2}$.

Third Embodiment

Figure 24:
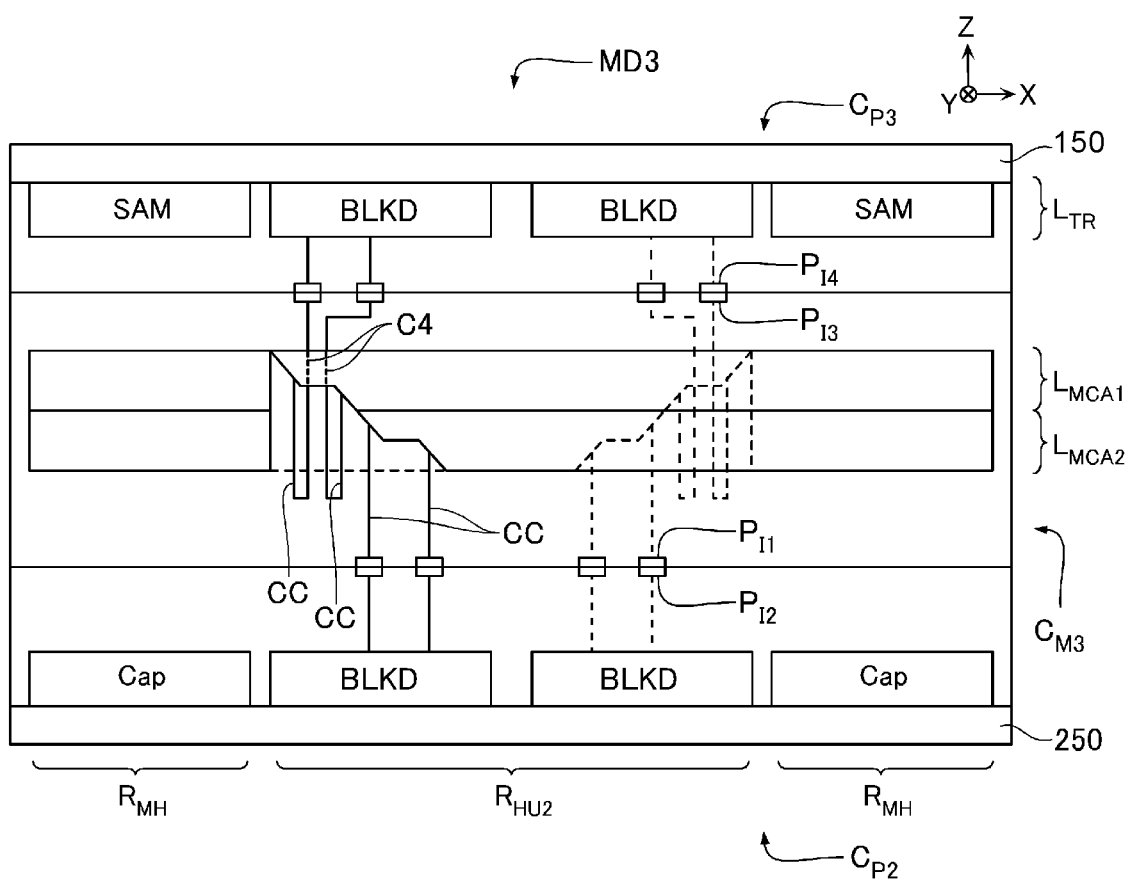
FIG. 24 is a cross-sectional view schematically illustrating a semiconductor storage device according to a third embodiment.

Next, a semiconductor storage device according to a third embodiment will be described with reference to FIG. 24. FIG. 24 is a cross-sectional view schematically illustrating a semiconductor storage device according to the third embodiment.

For example, as illustrated in FIG. 17 and the like, the memory die MD according to the first embodiment includes the chip $C_M$ including the memory cell array MCA, and the transistors Tr are provided in the chip $C_M$. Similarly, as described with reference to FIG. 23, for example, the memory die MD2 according to the second embodiment includes the chip $C_{M2}$ including the memory cell array MCA, and the transistors Tr are provided in the chip $C_{M2}$. On the other hand, for example, as illustrated in FIG. 24, a memory die MD3 according to the third embodiment includes a chip $C_{M3}$ including a memory cell array MCA, a chip $C_{P2}$ bonded to the front surface (lower surface) of the chip $C_{M3}$, and a chip $C_{P3}$ bonded to the rear surface (upper surface) of the chip $C_{M3}$.

The chip $C_{M3}$ is basically configured in a manner similar to the chip $C_M$. However, the chip $C_{M3}$ does not include the semiconductor substrate 100 and the transistor layer $L_{TR}$. A plurality of third bonding electrodes $P_{I3}$ are provided on the rear surface (upper surface) of the chip $C_{M3}$. The plurality of third bonding electrodes $P_{I3}$ are basically configured in a manner similar to the plurality of first bonding electrodes $P_{I1}$.

The chip $C_{P3}$ is basically configured in a manner similar to the chip $C_P$. However, a plurality of fourth bonding electrodes PI4 are provided on the front surface (lower surface) of the chip $C_{P3}$ instead of the plurality of second bonding electrodes $P_{I2}$. The plurality of fourth bonding electrodes PI4 are basically configured in a manner similar to the plurality of second bonding electrodes $P_{I2}$. However, the plurality of fourth bonding electrodes PI4 are connected not to the plurality of first bonding electrodes $P_{I1}$, but to the plurality of third bonding electrodes $P_{I3}$. Although not illustrated, a bonding pad electrode $P_X$ is provided on the rear surface (upper surface) of the chip $C_{P3}$.

Fourth Embodiment

Figure 25:
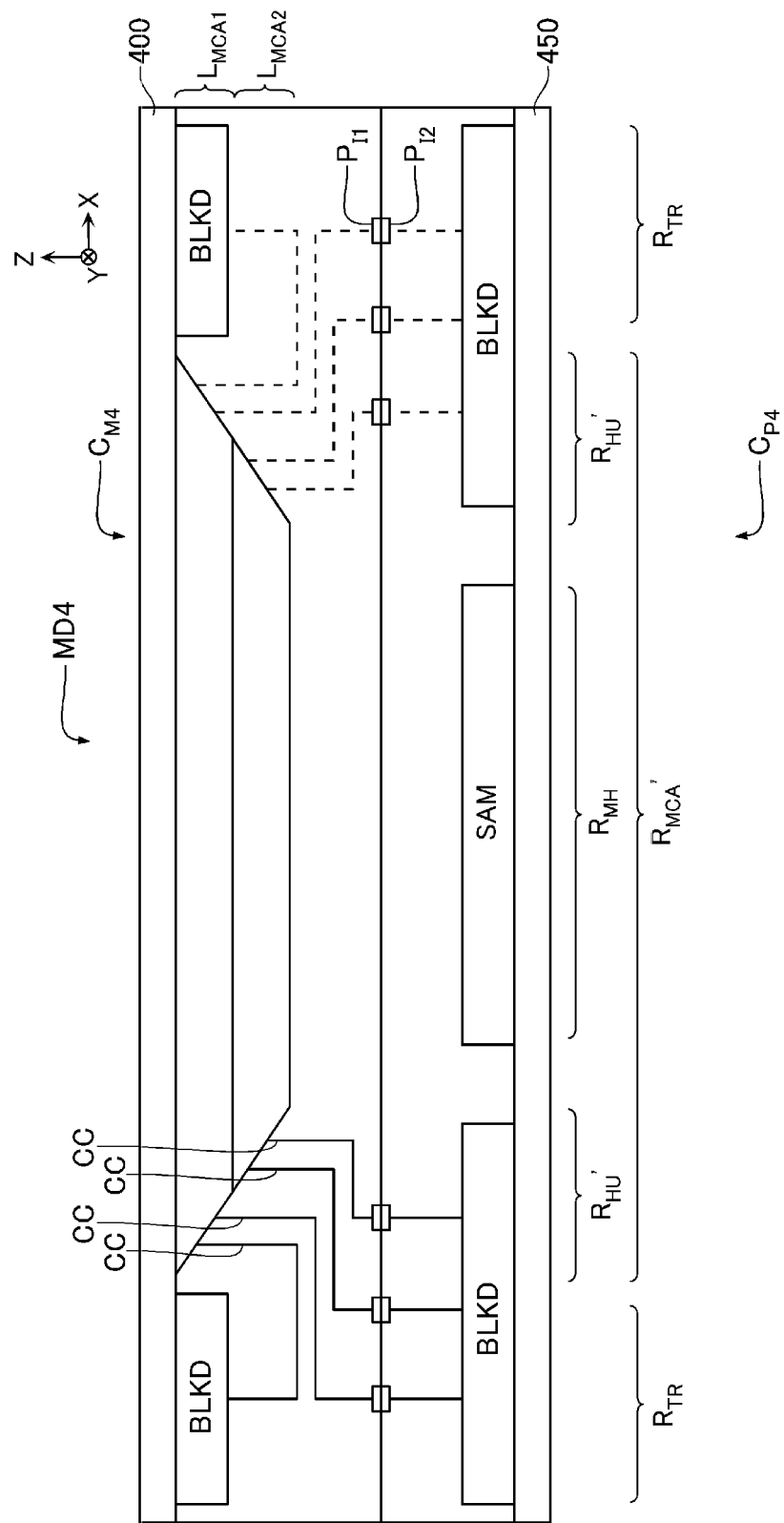
FIG. 25 is a cross-sectional view schematically illustrating a semiconductor storage device according to a fourth embodiment.

Next, a semiconductor storage device according to a fourth embodiment will be described with reference to FIG. 25. FIG. 25 is a cross-sectional view schematically illustrating a semiconductor storage device according to the fourth embodiment.

For example, as illustrated in FIG. 17 and the like, the memory die MD according to the first embodiment includes the chip $C_M$ and the chip $C_P$. The chip $C_M$ includes the memory cell array layers $L_{MCA1}$ and $L_{MCA2}$, and the transistor layer $L_{TR}$. The transistor layer $L_{TR}$ is spaced from the memory cell array layers $L_{MCA1}$ and $L_{MCA2}$ in the Z direction. On the other hand, for example, as illustrated in FIG. 25, a memory die MD4 according to the fourth embodiment includes a chip $C_{M4}$ including a memory cell array MCA and a chip $C_{P4}$ bonded to the chip $C_{M4}$.

The chip $C_{M4}$ is basically configured in a manner similar to the chip $C_M$. However, the chip $C_{M4}$ includes a semiconductor substrate 400 instead of the semiconductor substrate 100. The chip $C_{M4}$ does not include the transistor layer $L_{TR}$. The semiconductor substrate 400 is basically configured in a manner similar to the semiconductor substrate 100. However, a memory cell array region $R_{MCA}'$ is provided in the semiconductor substrate 400 instead of the memory cell array region $R_{MCA}$. The memory cell array region $R_{MCA}'$ has a memory hole region $R_{MH}'$ and two hookup regions $R_{HU}'$ adjacent to the memory hole region $R_{MH}'$. A transistor region RTR is provided at a position adjacent to the memory cell array region $R_{MCA}'$ in the X direction.

The configuration of the memory hole region $R_{MH}'$ of the memory cell array layers $L_{MCA1}$ and $L_{MCA2}$ is basically similar to the configuration of the memory hole region $R_{MH}$ of the memory cell array layers $L_{MCA1}$ and $L_{MCA2}$ in the chip $C_M$. However, a conductive layer 112 is not provided in the memory hole region $R_{MH}'$. The upper end of the semiconductor pillar 120 in the memory hole region $R_{MH}$ is connected not to the conductive layer 112 but to the semiconductor substrate 400.

The hookup region $R_{HU}'$ is basically configured in a manner similar to the first hookup region $R_{HU1}$ and the second hookup region $R_{HU2}$. However, a contact connection small-region $r_{C4T}$ is not provided in the hookup region $R_{HU}'$.

In the transistor region $R_{TR}$, a plurality of transistors Tr are provided on the front surface (lower surface) of the semiconductor substrate 400. The plurality of transistors Tr constitute a portion of the block decoder BLKD. The plurality of transistors Tr are connected to the components in the memory cell array layer $L_{MCA1}$ via contacts CC or the like.

The chip $C_{P4}$ is basically configured in a manner similar to the chip $C_P$. However, the chip $C_{P4}$ includes a semiconductor substrate 450 instead of the semiconductor substrate 150. The semiconductor substrate 450 is basically configured in a manner similar to the semiconductor substrate 150. However, among the plurality of transistors Tr provided on the front surface (upper surface) of the semiconductor substrate 450, the transistors Tr provided in the hookup region $R_{HU}'$ and the transistor region RTR constitute a portion of the block decoder BLKD. The plurality of transistors Tr are connected to the components in the memory cell array layers $L_{MCA1}$ and $L_{MCA2}$ via the contacts CC, the first bonding electrode $P_{I1}$, the second bonding electrode $P_{I2}$, and the like.

Other Embodiments

Hitherto, the semiconductor storage device according to the first to fourth embodiments has been described. However, the semiconductor storage device to the above embodiments are merely examples, and specific configurations, operations, and the like can be appropriately adjusted.

Figure 26:
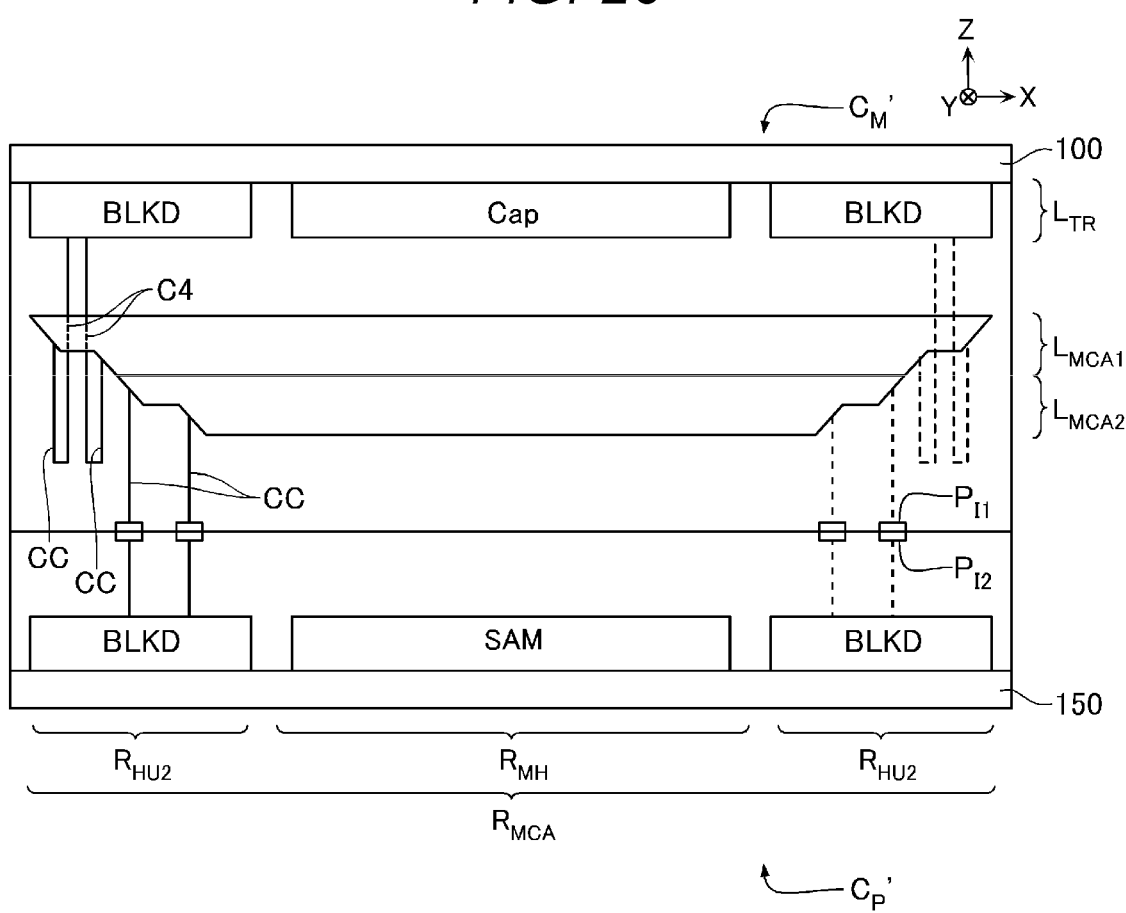
FIG. 26 is a cross-sectional view schematically illustrating a semiconductor storage device according to another embodiment.

For example, as illustrated in FIGS. 17, 23, and 24, in the semiconductor storage device according to the first to third embodiments, the two memory hole regions $R_{MH}$ arranged in the X direction are provided in the memory cell array region $R_{MCA}$, and the second hookup region $R_{HU2}$ is provided between the two memory hole regions $R_{MH}$. On the other hand, for example, a chip $C_M'$ and a chip $C_P'$ illustrated in FIG. 26 are basically configured in a manner similar to the chip $C_M$ and the chip $C_P$ according to the first embodiment. However, in the chip $C_M'$, two second hookup regions $R_{HU2}$ arranged in the X direction are provided in a memory cell array region $R_{MCA}$, and a memory hole region $R_{MH}$ is provided between the two second hookup regions $R_{HU2}$. Among a plurality of transistors Tr provided on the front surfaces of the chip $C_M'$ and the chip $C_P'$, the transistors Tr provided in the second hookup region $R_{HU2}$ function as a portion of the block decoder BLKD.

Such a configuration can also be applied to the semiconductor storage device according to the second or third embodiment.

Figure 27:
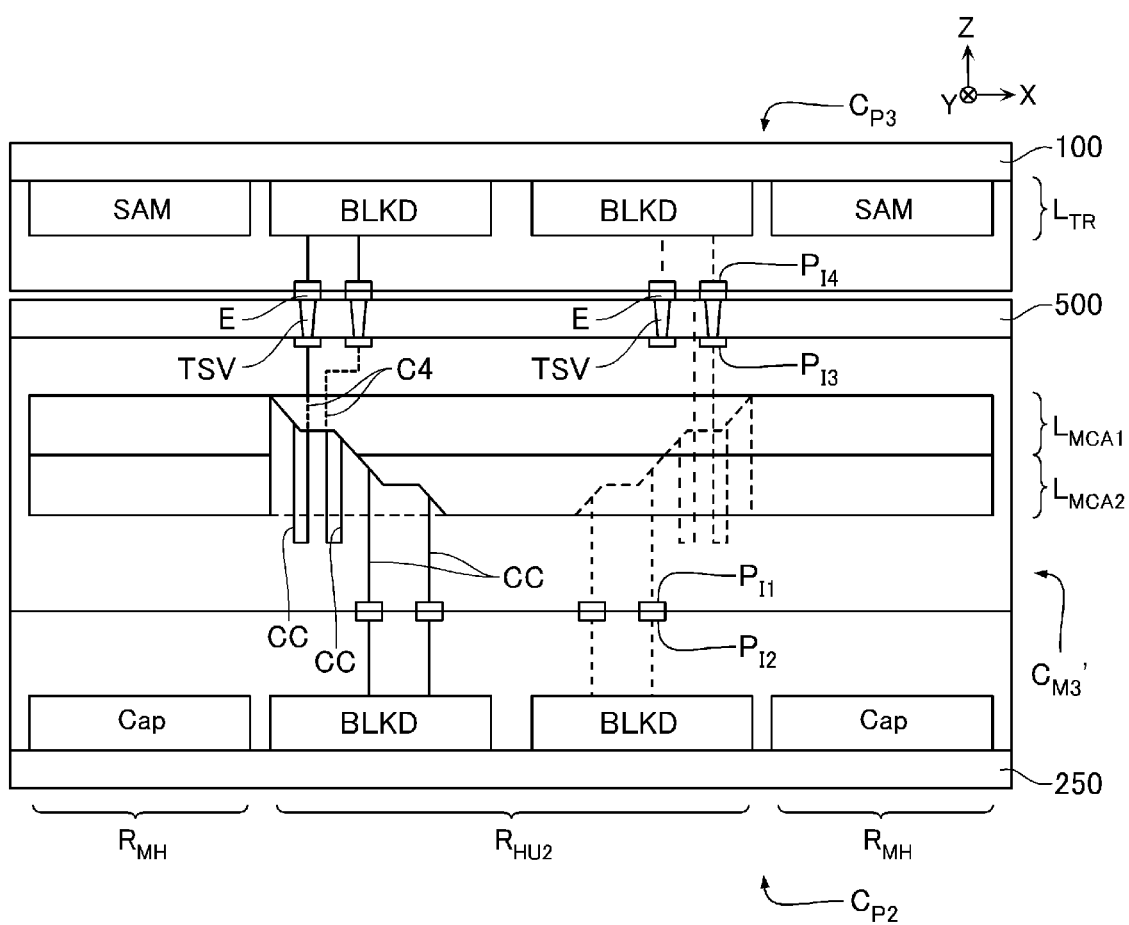
FIG. 27 is a cross-sectional view schematically illustrating a semiconductor storage device according to still another embodiment.

For example, as illustrated in FIG. 24, in the semiconductor storage device according to the third embodiment, the chip $C_{M3}$ does not include the semiconductor substrate. The plurality of third bonding electrodes $P_{I3}$ are provided on the rear surface (upper surface) of the chip $C_{M3}$. On the other hand, for example, a chip $C_{M3}'$ illustrated in FIG. 27 includes a semiconductor substrate 500. The chip $C_{M3}'$ includes a plurality of through-electrode TSVs penetrating the semiconductor substrate 500 and electrodes E provided at the upper ends of the plurality of through-electrodes TSV. In such a configuration, some conductive layers 110 in the memory cell array layers $L_{MCA1}$ and $L_{MCA2}$ are connected to the transistors Tr included in the block decoder BLKD in the chip $C_{P3}$ via the contacts CC, the contacts C4, the third bonding electrodes $P_{I3}$, the through-electrodes TSV, the electrodes E, and the fourth bonding electrodes PI4.

In the above example, among a plurality of conductive layers 110 provided in the memory cell array layers $L_{MCA1}$ and $L_{MCA2}$, the conductive layer 110 connected to the transistor Tr in the chip $C_M$, $C_{M2}$, $C_{M4}$, or $C_M'$ (referred to as the "chip $C_M$ or the like" below) and the conductive layer 110 connected to the transistor Tr in the chip $C_P$, $C_{P2}$, $C_{P3}$, $C_{P4}$, or $C_P'$ (referred to as the "chip $C_P$ or the like" below) can be appropriate adjusted.

For example, a plurality of conductive layers 110 included in one of the memory cell array layers $L_{MCA1}$ and $L_{MCA2}$ are connected to the transistors Tr in the chip $C_M$ or the like, and a plurality of conductive layers 110 included in the other memory cell array layer may be connected to the transistors Tr in the chip $C_P$ or the like.

For example, the number of conductive layers 110 connected to the transistors Tr in the chip $C_P$ or the like may be greater than the number of conductive layers 110 connected to the transistors Tr in the chip $C_M$ or the like. As described above, for the reason in the manufacturing process, the transistor Tr in the chip $C_M$ may have a more difficulty in high density integration than the transistor Tr in the chip $C_P$. Thus, it is possible to reduce the circuit area by setting the number of conductive layers 110 connected to the transistors Tr in the chip $C_P$ or the like to be greater than the number of conductive layers 110 connected to the transistors Tr in the chip $C_M$ or the like.

Further, for example, the even-numbered or odd-numbered conductive layers 110 counting from the top may be connected to the transistors Tr in the chip $C_P$ or the like, and the odd-numbered or even-numbered conductive layers 110 counting from the top maybe connected to the transistors Tr in the chip $C_M$ or the like. For example, the conductive layers 110 included in the even-numbered or odd-numbered memory blocks BLK counting from one side (for example, negative side in the Y direction. see FIG. 12) in the Y direction may be connected to the transistors Tr in the chip $C_P$ or the like, and the conductive layers 110 included in the odd-numbered or even-numbered memory blocks BLK counting from the one side in the Y direction may be connected to the transistors Tr in the chip $C_M$ or the like. For example, the conductive layers 110 included in one of the memory blocks BLKa and BLKf described with reference to FIG. 12 and the like may be connected to the transistors Tr in the chip $C_P$ or the like, and the conductive layers 110 included in the other of the memory blocks BLKa and BLKf may be connected to the transistors Tr in the chip $C_M$ or the like.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein maybe made without departing from the spirit of the disclosure. The accompanying claims and their equivalents are intended to cover such forms or modifications as would fall within the scope and spirit of the disclosure.

What is claimed is:

1. A semiconductor storage device comprising:
   a first semiconductor substrate having a first active region;
   a second semiconductor substrate having a second active region;
   a first memory cell and a second memory cell provided between the first semiconductor substrate and the second semiconductor substrate;
   a first word line electrically connected to a gate of the first memory cell;
   a second word line electrically connected to a gate of the second memory cell;
   a first transistor that is provided on the first semiconductor substrate and has a channel region thereof in the first active region, the first transistor having a first source and a first drain that are electrically connected between the first word line and a first wiring, the first transistor configured to control supply of a voltage from the first wiring to the gate of the first memory cell through the first word line; and
   a second transistor that is provided on the second semiconductor substrate and has a channel region thereof in the second active region, the second transistor having a second source and a second drain that are electrically connected between the second word line and a second wiring, the second transistor configured to control supply of a voltage from the second wiring to the gate of the second memory cell through the second word line.

2. The semiconductor storage device according to claim 1, further comprising:
   a first chip including
      the first semiconductor substrate,
      the first memory cell and the second memory cell,
      the first word line,
      the second word line,
      the first transistor, and
      a first bonding electrode electrically connected to the second word line; and
   a second chip including
      the second semiconductor substrate,
      the second transistor, and
      a second bonding electrode electrically connected to the second transistor,
   wherein the second chip is bonded to the first chip via the first bonding electrode and the second bonding electrode.

3. The semiconductor storage device according to claim 2, wherein
   a width of the first active region in a first direction, along which the first and second word lines extend, is greater than a width of the second active region in the first direction.

4. The semiconductor storage device according to claim 3, further comprising:
   a bit line; and
   a sense amplifier module including a plurality of transistors including a sense transistor having a gate electrically connected to the bit line,
   wherein a plurality of third transistors are provided on the first semiconductor substrate and at least one of the third transistors are transistors of the sense amplifier module.

5. The semiconductor storage device according to claim 3, further comprising:
   a bit line; and
   a sense amplifier module including a plurality of transistors including a sense transistor having a gate electrically connected to the bit line,
   wherein a plurality of third transistors are provided on the first semiconductor substrate and none of the third transistors are transistors of the sense amplifier module.

6. The semiconductor storage device according to claim 1, further comprising:
   a first chip including
      the first memory cell and the second memory cell,
      the first word line,
      the second word line,
      a first bonding electrode electrically connected to the first word line, and
      a second bonding electrode electrically connected to the second word line;
   a second chip including
      the first semiconductor substrate,
      the first transistor, and
      a third bonding electrode electrically connected to the first transistor; and
   a third chip including
      the second semiconductor substrate,
      the second transistor, and
      a fourth bonding electrode electrically connected to the second transistor,
   wherein
      the second chip is bonded to the first chip via the first bonding electrode and the third bonding electrode, and
      the third chip is bonded to the first chip via the second bonding electrode and the fourth bonding electrode.

7. The semiconductor storage device according to claim 1, further comprising:
   a first contact extending in a second direction intersecting a surface of the first semiconductor substrate and electrically connected between the first word line and the first transistor, wherein
   the first word line and the second word line are spaced apart in the second direction, and
   a first end of the first contact is closer to the first semiconductor substrate in the second direction than the first word line and the second word line, and a second end of the first contact is closer to the second semiconductor substrate in the second direction than the first word line and the second word line.

8. The semiconductor storage device according to claim 7, further comprising:
   a memory cell array that includes the first and second memory cells; and
   a second contact in direct contact with the first word line, extending in the second direction, and electrically connected to the second end of the first contact through a wiring that is between the memory cell array and the second semiconductor substrate in the second direction.

9. The semiconductor storage device according to claim 1, further comprising:
a first chip including the first semiconductor substrate, a memory cell array including the first memory cell and the second memory cell, the first word line and the second word line, the first transistor and a capacitor formed on the first semiconductor substrate, a first pad electrode electrically connected to a first end of the capacitor and to which a power supply voltage is to be applied, and a second pad electrode electrically connected to a second end of the capacitor and to which a ground voltage is to be applied.

10. The semiconductor storage device according to claim 1, further comprising:
a first chip including the first semiconductor substrate, a memory cell array including the first memory cell and the second memory cell, a plurality of word lines including the first and second word lines, the first transistor, and a hookup region into which the plurality of word lines extend, wherein
each word line that is closer to the first semiconductor substrate than a neighboring word line adjacent thereto extends further into the hookup region than the neighboring word line so that a stair-shaped pattern is formed by the word lines extending into the hookup region.

11. A semiconductor storage device comprising:
a first chip;
a second chip including a first semiconductor substrate; and
a third chip including a second semiconductor substrate, the first chip being bonded to the second chip and the third chip,
the first chip including:
  a first memory cell and a second memory cell provided between the first semiconductor substrate and the second semiconductor substrate,
  a first word line electrically connected to the first memory cell;
  a second word line electrically connected to the second memory cell;
  a first bonding electrode electrically connected to the first word line, and
  a second bonding electrode electrically connected to the second word line, the second chip also including:
  a first transistor that is provided on the first semiconductor substrate and electrically connected between the first word line and a first wiring through which a voltage is applied to the first word line, and
  a third bonding electrode electrically connected to the first transistor, the third chip also including:
  a second transistor that is provided on the second semiconductor substrate and electrically connected between the second word line and a second wiring through which a voltage is applied to the second word line, and
  a fourth bonding electrode electrically connected to the second transistor, wherein
the second chip is bonded to the first chip via the first bonding electrode and the third bonding electrode, and
the third chip is bonded to the first chip via the second bonding electrode and the fourth bonding electrode.

12. A semiconductor storage device, comprising:
a first semiconductor substrate;
a second semiconductor substrate;
a first memory cell and a second memory cell provided between the first semiconductor substrate and the second semiconductor substrate;
a first word line electrically connected to the first memory cell;
a second word line electrically connected to the second memory cell;
a first transistor that is provided on the first semiconductor substrate and electrically connected between the first word line and a first wiring through which a voltage is applied to the first word line;
a second transistor that is provided on the second semiconductor substrate and electrically connected between the second word line and a second wiring through which a voltage is applied to the second word line; and
a first contact extending in a direction intersecting a surface of the first semiconductor substrate and electrically connected between the first word line and the first transistor, wherein
the first word line and the second word line are spaced apart in the direction, and
a first end of the first contact is closer to the first semiconductor substrate in the direction than the first word line and the second word line, and a second end of the first contact is closer to the second semiconductor substrate in the direction than the first word line and the second word line.

13. The semiconductor storage device according to claim 12, further comprising:
a memory cell array that includes the first and second memory cells; and
a second contact in direct contact with the first word line, extending in the direction, and electrically connected to the second end of the first contact through a wiring that is between the memory cell array and the second semiconductor substrate in the direction.

* * * * *